United States Patent
Jang et al.

(10) Patent No.: US 10,943,812 B2
(45) Date of Patent: Mar. 9, 2021

(54) SEMICONDUCTOR DEVICES

(71) Applicant: Samsung Electronics Co., Ltd., Suwon-si (KR)

(72) Inventors: Semyeong Jang, Gunpo-si (KR); Bong-Soo Kim, Yongin-si (KR); Heejae Chae, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/535,808

(22) Filed: Aug. 8, 2019

(65) Prior Publication Data
US 2020/0203215 A1 Jun. 25, 2020

(30) Foreign Application Priority Data
Dec. 24, 2018 (KR) .................. 10-2018-0168299

(51) Int. Cl.
*H01L 27/105* (2006.01)
*H01L 27/24* (2006.01)
*H01L 27/22* (2006.01)
*H01L 27/108* (2006.01)
*H01L 21/762* (2006.01)

(52) U.S. Cl.
CPC .... *H01L 21/76229* (2013.01); *H01L 27/1052* (2013.01); *H01L 27/10805* (2013.01); *H01L 27/226* (2013.01); *H01L 27/2436* (2013.01)

(58) Field of Classification Search
None
See application file for complete search history.

(56) References Cited

U.S. PATENT DOCUMENTS

| | | | |
|---|---|---|---|
| 7,785,984 B2 | 8/2010 | Yamada et al. | |
| 8,008,163 B2 | 8/2011 | Jang et al. | |
| 8,551,861 B2 | 10/2013 | Nam | |
| 8,809,993 B2 | 8/2014 | Kwak et al. | |
| 8,941,210 B2 | 1/2015 | Kim | |
| 2006/0046425 A1* | 3/2006 | Sandhu | H01L 27/1052 438/424 |
| 2006/0166437 A1* | 7/2006 | Korber | H01L 27/1052 438/257 |

(Continued)

FOREIGN PATENT DOCUMENTS

| | | |
|---|---|---|
| KR | 10-2003-0004545 A | 1/2003 |
| KR | 10-2009-0081735 A | 7/2009 |

(Continued)

*Primary Examiner* — Evren Seven
(74) *Attorney, Agent, or Firm* — Harness, Dickey & Pierce, P.L.C.

(57) ABSTRACT

A semiconductor device includes a first trench on the device region, a first device isolation layer in the first trench and defining an active pattern of the device region, a second trench on the interface region, and a second device isolation layer in the second trench. The second isolation layer includes a buried dielectric pattern, a dielectric liner pattern on the buried dielectric pattern, and a first gap-fill dielectric pattern on the dielectric liner pattern. The buried dielectric pattern includes a floor segment on a floor of the second trench, and a sidewall segment on a sidewall of the second trench. The sidewall segment has a thickness different from a thickness of the floor segment.

18 Claims, 26 Drawing Sheets

(56) References Cited

U.S. PATENT DOCUMENTS

| | | | |
|---|---|---|---|
| 2007/0210403 A1* | 9/2007 | Sandhu | H01L 27/11526 257/499 |
| 2008/0176379 A1* | 7/2008 | Lee | H01L 21/76229 438/443 |
| 2011/0045643 A1* | 2/2011 | Yoon | H01L 21/308 438/129 |
| 2012/0156844 A1* | 6/2012 | Kim | H01L 27/10891 438/270 |
| 2013/0241027 A1* | 9/2013 | Kwak | H01L 29/0649 257/506 |
| 2015/0091127 A1* | 4/2015 | Lee | H01L 21/76229 257/506 |
| 2015/0179259 A1* | 6/2015 | Kim | G11C 7/1003 711/125 |
| 2017/0186642 A1* | 6/2017 | Kim | H01L 21/02362 |
| 2017/0352665 A1* | 12/2017 | Luan | H01L 27/1052 |
| 2018/0096947 A1* | 4/2018 | Lee | H01L 27/10823 |

FOREIGN PATENT DOCUMENTS

| | | |
|---|---|---|
| KR | 10-1185946 B1 | 9/2012 |
| KR | 10-2014-0048519 A | 4/2014 |
| KR | 10-1491726 B1 | 2/2015 |

\* cited by examiner

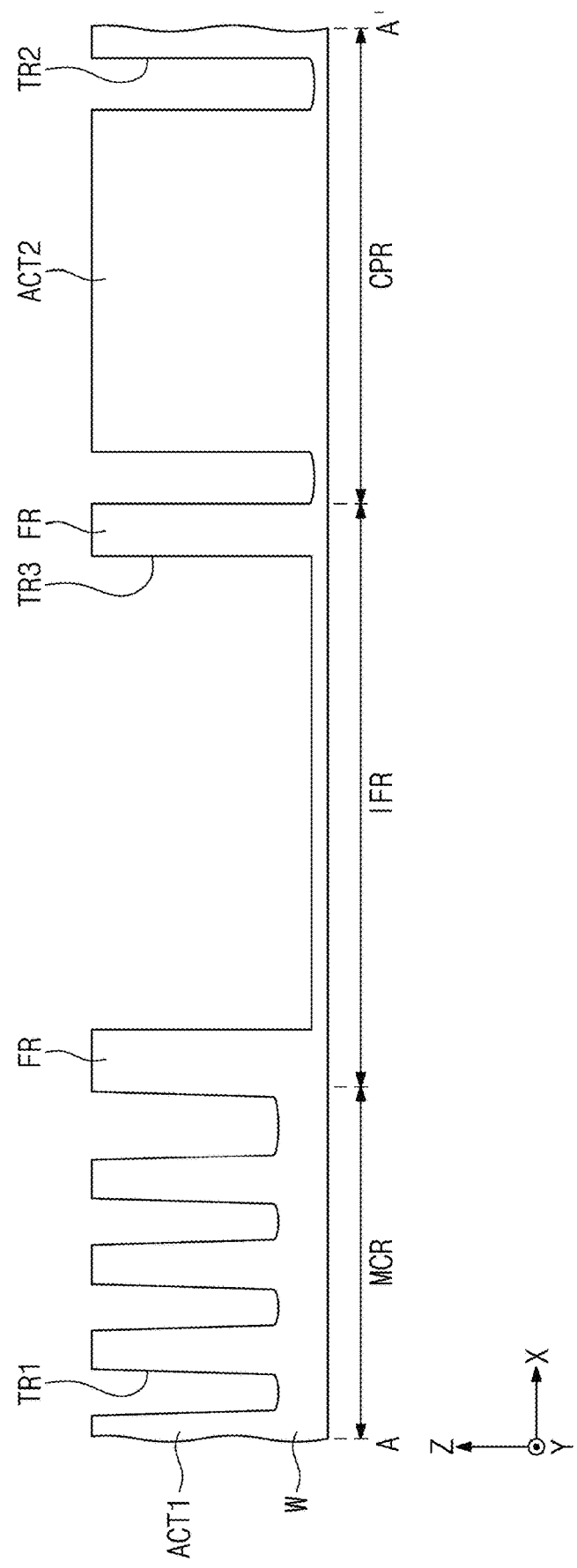

SEMICONDUCTOR DEVICES

CROSS-REFERENCE TO RELATED APPLICATION

This U.S. nonprovisional application claims priority under 35 U.S.C. § 119 to Korean Patent Application No. 10-2018-0168299 filed on Dec. 24, 2018 in the Korean Intellectual Property Office, the entire contents of which are hereby incorporated by reference.

BACKGROUND

The present inventive concepts relate to semiconductor devices, and more particularly, to semiconductor devices including a data storage element.

Semiconductor devices have an important role in the electronic industry because of their small size, multi-functionality, and/or low fabrication cost. Data storage devices among the semiconductor devices can store logic data. Data storage devices are increasingly integrated with the development of the electronic industry. As a result, sizes (e.g., line widths) of components at least partially comprising data storage devices continue to decrease.

Additionally, high reliability of data storage devices has been demanded concurrently with the increased integration of data storage devices. However, increased integration of data storage devices may result in reduced reliability of the data storage devices. Therefore, various studies have been conducted to improve the reliability of data storage devices.

SUMMARY

Some example embodiments of the present inventive concepts provide semiconductor devices having improved uniformity of threshold voltage.

According to some example embodiments of the present inventive concepts, a semiconductor device may include a substrate including a device region and an interface region adjacent to the device region, a first trench on the device region, a first device isolation layer in the first trench, the first device isolation layer defining an active pattern of the device region, a second trench on the interface region, and a second device isolation layer in the second trench. The second isolation layer may include a buried dielectric pattern, a dielectric liner pattern on the buried dielectric pattern, and a first gap-fill dielectric pattern on the dielectric liner pattern. The buried dielectric pattern may include a floor segment on a floor of the second trench, and a sidewall segment on a sidewall of the second trench. The sidewall segment may have a thickness different from a thickness of the floor segment.

According to some example embodiments of the present inventive concepts, a semiconductor device may include a first trench on a substrate, the first trench extending in a first direction, a buried dielectric pattern on a sidewall and a floor of the first trench, a dielectric liner pattern on the buried dielectric pattern, a first gap-fill dielectric pattern on the dielectric liner pattern and filling the first trench, and a plurality of second trenches extending in a second direction intersecting the first direction, the second trenches being shallower than the first trench. The buried dielectric pattern may include a floor segment on the floor of the first trench, and a sidewall segment on the sidewall of the first trench, the sidewall segment having a thickness different from a thickness of the floor segment.

According to some example embodiments of the present inventive concepts, a semiconductor device may include a substrate including first and second device regions and an interface region between the first and second device regions, first and second trenches defining separate, respective active patterns of first and second active patterns on the first and second device regions, a third trench on the interface region, first, second, and third device isolation layers in separate, respective trenches of the first, second, and third trenches, and a plurality of fourth trenches extending across the first and second active patterns. The third isolation layer may include a buried dielectric pattern, a dielectric liner pattern on the buried dielectric pattern, and a first gap-fill dielectric pattern on the dielectric liner pattern and filling the third trench. The buried dielectric pattern may include a floor segment on a floor of the third trench, and a sidewall segment on a sidewall of the third, the sidewall segment having a thickness greater than a thickness of the floor segment.

BRIEF DESCRIPTION OF THE DRAWINGS

FIGS. 4A, 6A, 8A, 10A, and 12A illustrate cross-sectional views taken along line A-A' of FIGS. 3, 5, 7, 9, and 11, respectively, according to some example embodiments of the present inventive concepts.

DETAILED DESCRIPTION OF EMBODIMENTS

Figure 1:
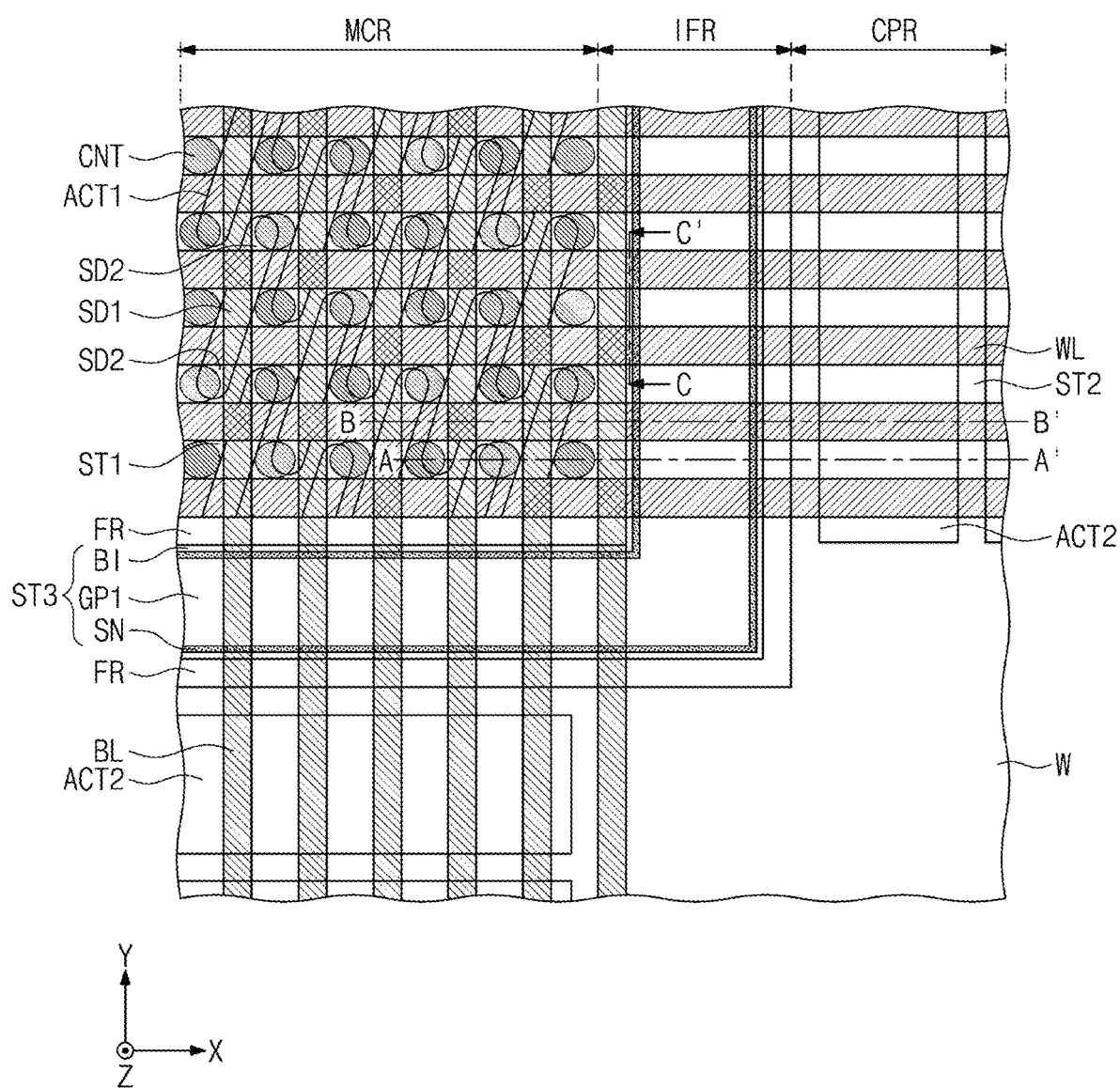
FIG. 1 illustrates a plan view showing an example of a semiconductor device according to some example embodiments of the present inventive concepts.
Figure 2A:
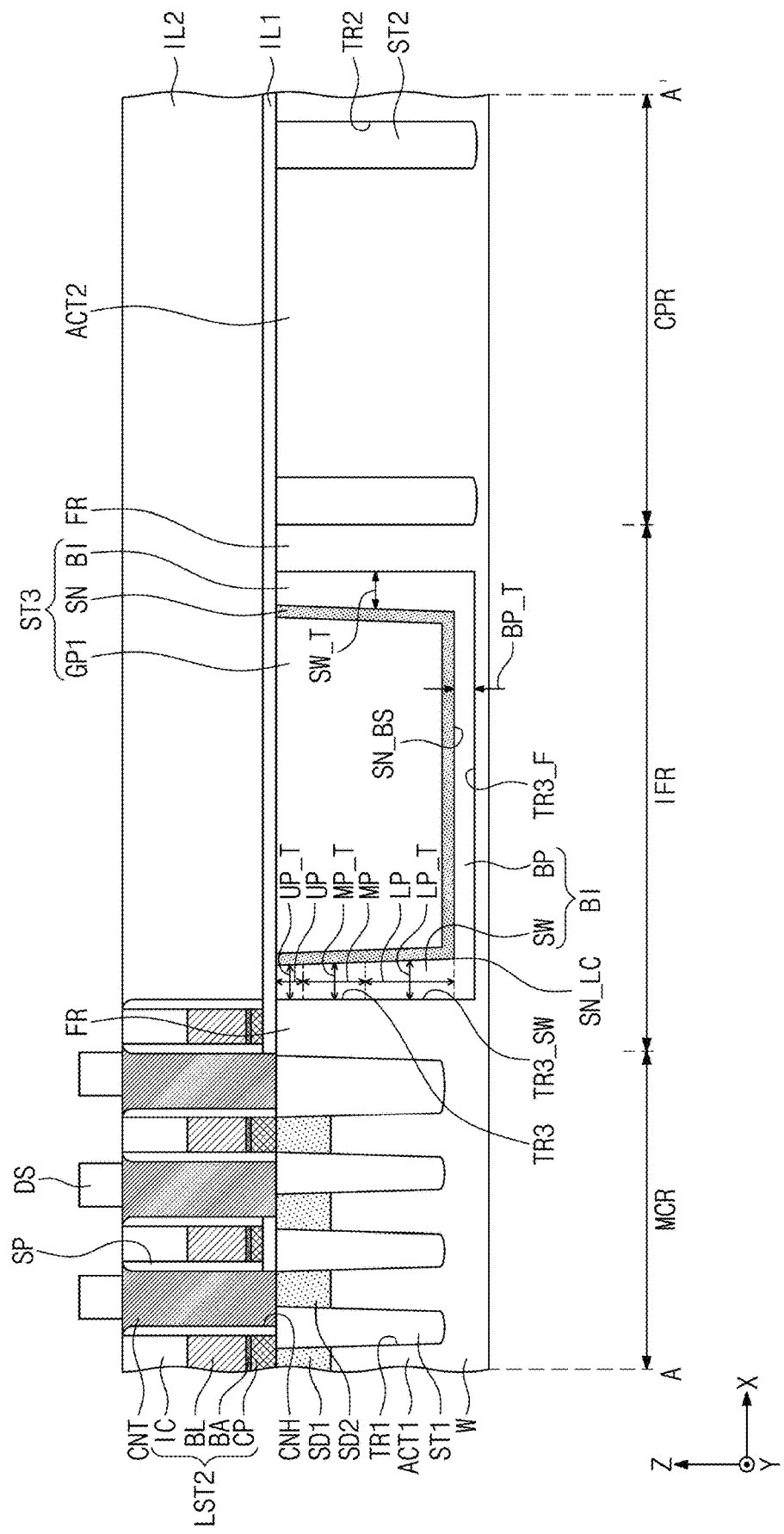
FIGS. 2A, 2B, and 2C illustrate cross-sectional views respectively taken along lines A-A', B-B', and C-C' of FIG. 1 according to some example embodiments of the present inventive concepts.
Figure 2B:
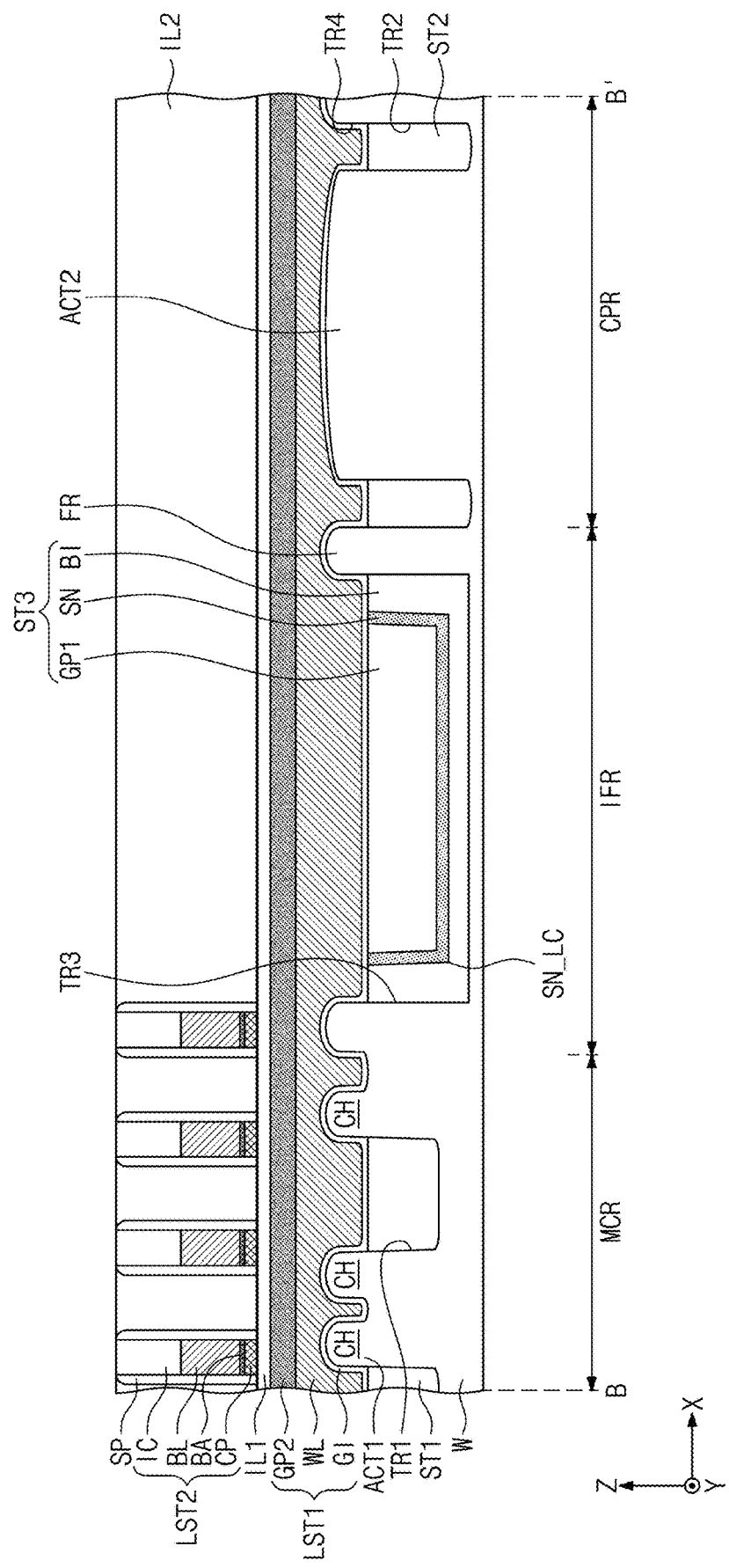
Figure 2C:
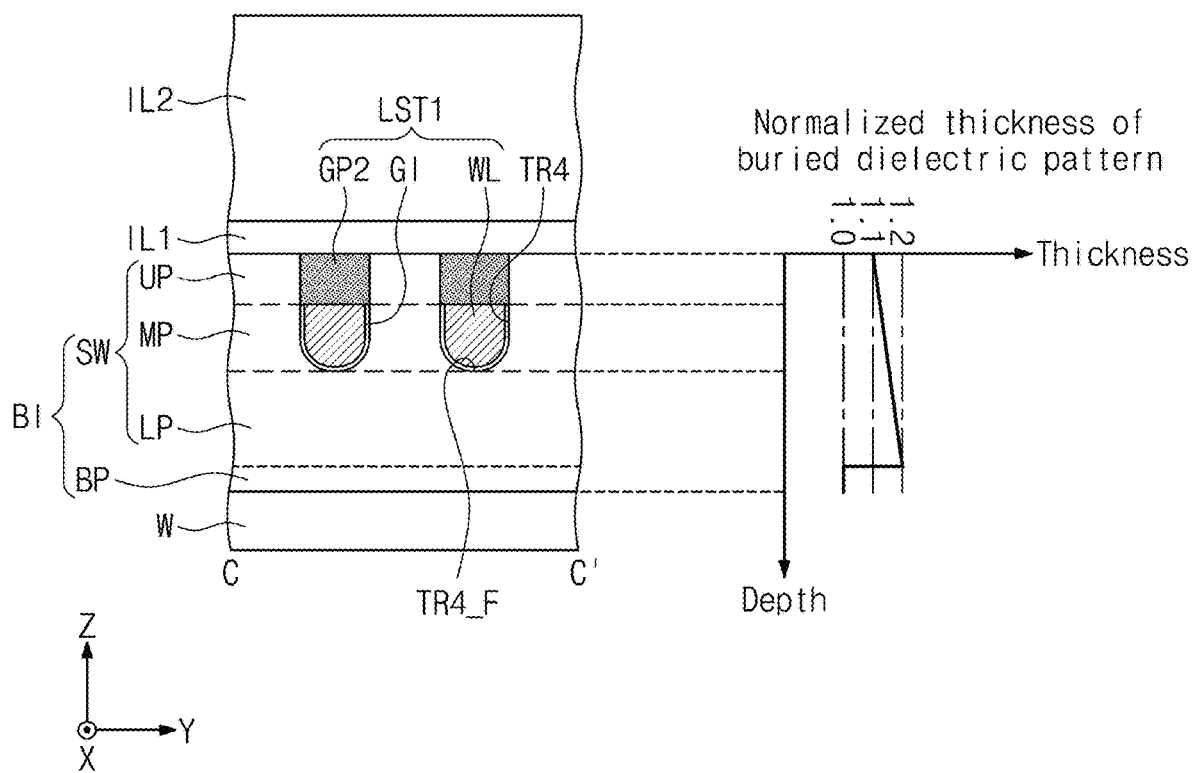
Figure 3:
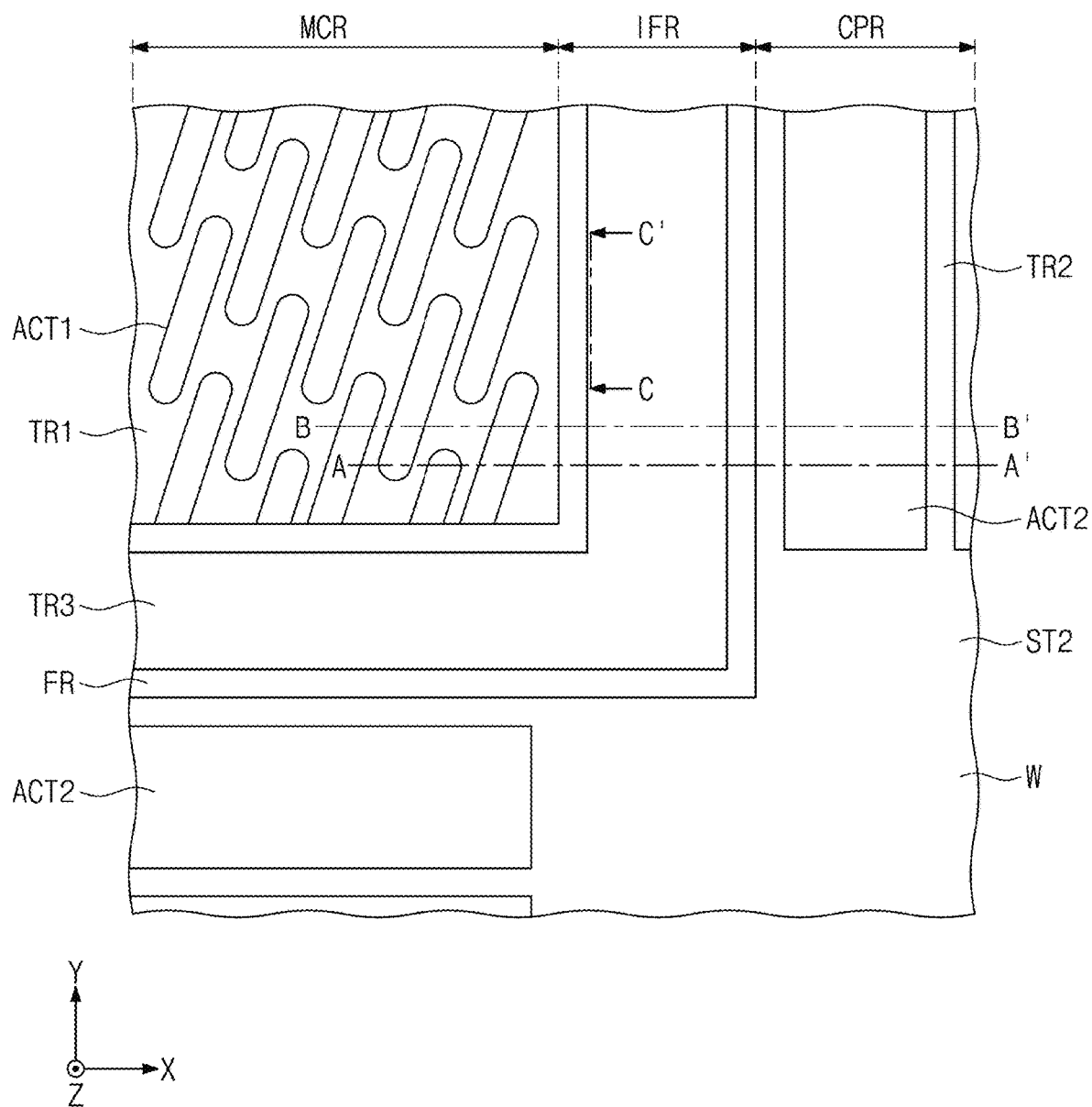
FIGS. 3, 5, 7, 9, and 11 illustrate plan views showing a method of fabricating the semiconductor device shown in FIG. 1 according to some example embodiments of the present inventive concepts.
Figure 4B:
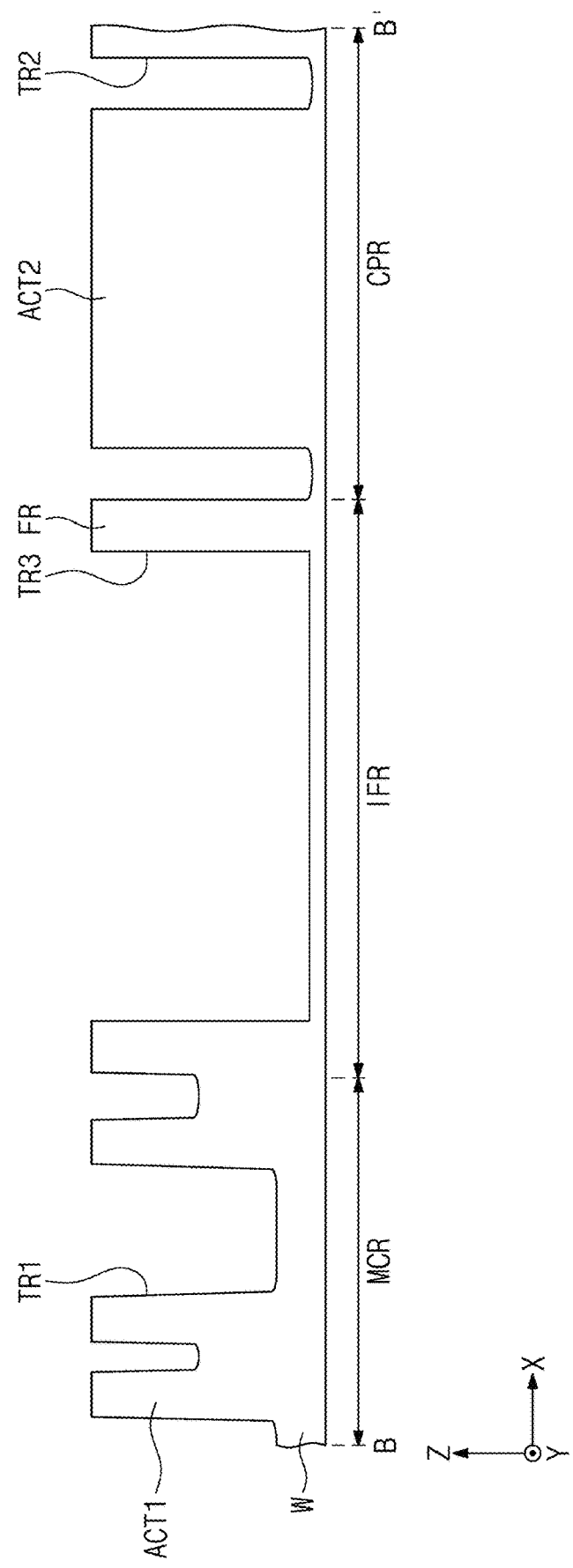
FIGS. 4B, 6B, 8B, 10B, and 12B illustrate cross-sectional views taken along line B-B' of FIGS. 3, 5, 7, 9, and 11, respectively, according to some example embodiments of the present inventive concepts.
Figure 4C:
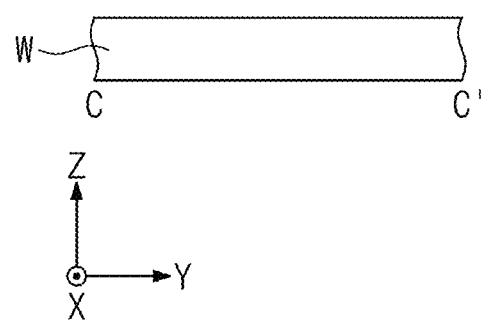
FIGS. 4C, 6C, 8C, 10C, and 12C illustrate cross-sectional views taken along line C-C' of FIGS. 3, 5, 7, 9, and 11, respectively, according to some example embodiments of the present inventive concepts.

FIG. 1 illustrates a plan view showing an example of a semiconductor device according to some example embodiments of the present inventive concepts. FIGS. 2A and 2B illustrate cross-sectional views respectively taken along lines A-A' and B-B' of the semiconductor device of FIG. 1 according to some example embodiments of the present inventive concepts. FIG. 2C illustrates a cross-sectional view taken along line C-C' of the semiconductor device of FIG. 1 and a graph showing how a normalized thickness varies with a depth of a buried dielectric pattern according to some example embodiments of the present inventive concepts.

Referring to FIGS. 1 and 2A to 2C, a semiconductor device may include a substrate W which includes first and second device regions MCR and CPR and an interface region IFR between the first and second device regions MCR and CPR. In some example embodiments, the first device region MCR may be a memory cell region. The first device region MCR may include a data storage element DS. The data storage element DS may store data in response to signals of a word line WL and a bit line BL. The second device region CPR may be a core/peripheral circuit region. The second device region CPR may include a core/peripheral circuit, such as a word line driver, a bit line driver, and a sense amplifier, that writes data in and read data from the data storage element DS through the word line WL and the bit line BL. The interface region IFR may be a field region that separates the first and second device regions MCR and CPR from each other. The interface region IFR may be adjacent to each device region of the first and second device regions MCR and CPR. The word line WL and the bit line BL will be further discussed below.

The first device region MCR may include a first trench TR1, such that the first trench TR1 may be understood to be on the first device region MCR. A first device isolation layer ST1 may be provided in the first trench TR1 of the first device region MCR. As shown in at least FIG. 2A, the first device isolation layer ST1 may partially or entirely fill the first trench TR1. The first device isolation layer ST1 may include, in some example embodiments, silicon oxide. The first device isolation layer ST1 may define an active pattern, including first active patterns ACT1, of the first device region MCR. When viewed in plan, the first active patterns ACT1 may be discontinuously arranged in a diagonal direction to first and second directions X and Y. The first active pattern ACT1 may have a channel region CH and first and second source/drain regions SD1 and SD2. As shown in at least FIG. 2B, the channel region CH may overlap the word line WL in the Z direction, which may be understood to be a direction extending perpendicular to the directions in which the first, second, third, and fourth trenches TR1, TR2, TR3, and TR4 extend. The first and second source/drain regions SD1 and SD2 may be disposed on opposite sides of the word line WL. Restated, a first source/drain region SD1 may be on one side of the word line WL, and a second source/drain region SD2 may be on another side of the word line WL. A distance between the first active patterns ACT1 may fall within a range from about 10 nm to about 300 nm. The first device isolation layer ST1 may have no defects such as voids or seams in the first trench TR1 between a pair of first active patterns ACT1. The defect-free first device isolation layer ST1 may provide the first active pattern ACT1 with improve uniformity of threshold voltage.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The second device region CPR may include a second trench TR2, such that the second trench TR2 may be understood to be on the second device region CPR. A second device isolation layer ST2 may be disposed in the second trench TR2 of the second device region CPR. As shown in at least FIG. 2A, the second device isolation layer ST2 may partially or entirely fill the second trench TR2. The second device isolation layer ST2 may include silicon oxide. The second device isolation layer ST2 may define second active patterns ACT2 of the second device region CPR. It will be understood that, as shown in FIGS. 2A-2C, in some example embodiments, the first and second trenches TR1 and TR2 may define separate, respective active patterns of first and second active patterns ACT1 and ACT2 on the first and second device regions MCR and CPR. The second active pattern ACT2 may include a core/peripheral circuit.

The interface region IFR may include a third trench TR3, such that the third trench TR3 may be understood to be on the interface region IFR. A third device isolation layer ST3 may be disposed in the third trench TR3 of the interface region IFR. As shown in at least FIG. 2A, the third device isolation layer ST3 may partially or entirely fill the third trench TR3. The third device isolation layer ST3 may be disposed between field patterns FR. The third device isolation layer ST3 between the field patterns FR may have a width greater than that of the first device region MCR between a pair of first active patterns ACT1. In some example embodiments, the third device isolation layer ST3 may include a buried dielectric pattern BI, a dielectric liner pattern SN, and a first gap-fill dielectric pattern GP1.

The buried dielectric pattern BI may be disposed on a sidewall and a floor of the third trench TR3. The buried dielectric pattern BI may be formed of the same layer as that of the first and second device isolation layers ST1 and ST2. In some example embodiments, the buried dielectric pattern BI may include silicon oxide. In certain embodiments, the buried dielectric pattern BI may have a non-uniform thickness. In some example embodiments, the buried dielectric pattern BI may have a larger thickness on the sidewall of the third trench TR3 and a smaller thickness on the floor of the third trench TR3.

When the buried dielectric pattern BI has a uniform thickness, the first and second device isolation layers ST1 and ST2 may have defects such as voids or seams. The occurrence of defects in the first isolation layer ST1 and/or the second device isolation layer ST2 may depend on a variation in thickness of the buried dielectric pattern BI. As shown in at least FIG. 2A, the buried dielectric pattern BI may include a floor segment BP and a sidewall segment SW. As shown, the floor segment BP may be disposed on the floor TR3_F of the third trench TR3. As further shown, the sidewall segment SW may be disposed on the sidewall TR3_SW of the third trench TR3. The sidewall segment SW may have a thickness SW_T different from a thickness BP_T of the floor segment BP. The sidewall segment SW may have a thickness SW_T smaller than a thickness BP_T of the floor segment BP. The sidewall segment SW may have a thickness SW_T greater than a thickness BP_T of the floor segment BP. In some example embodiments, the thickness SW_T of the sidewall segment SW may gradually increase in a downstream direction, or in a depth direction of the third trench TR3. When the thickness SW_T of the sidewall segment SW increases in the depth direction of the third trench TR3, the first and second device isolation layers ST1 and ST2 may have no defects such as voids or seams. In contrast, when the thickness SW_T of the sidewall segment SW decreases or maintains in the depth direction of the third trench TR3, the first and second device isolation layers ST1 and ST2 may have defects such as voids or seams.

As shown in at least FIG. 2A, the dielectric liner pattern SN may be disposed on the buried dielectric pattern BI. The dielectric liner pattern SN may have a uniform thickness. The dielectric liner pattern SN may include silicon nitride.

As shown in at least FIG. 2A, the first gap-fill dielectric pattern GP1 may be disposed on the dielectric liner pattern SN. The first gap-fill dielectric pattern GP1 may partially or entirely fill the third trench TR3. The first gap-fill dielectric pattern GP1 may include, in some example embodiments, silicon oxide. The first gap-fill dielectric pattern GP1 may have a density less than the density of the buried dielectric pattern BI.

In FIGS. 2A and 2B, the second trench TR2 is illustrated to have a similar width to that of the first trench TR1. When the width of the second trench TR2 is greater than that of the first trench TR1, the second device isolation layer ST2 may include a buried dielectric pattern, a dielectric liner pattern, and a first gap-fill dielectric pattern. The buried dielectric pattern of the second device isolation layer ST2 may have a thicker sidewall segment and a thinner floor segment.

Referring further to FIGS. 1 and 2A to 2C, at least a pair of fourth trenches TR4 (e.g., a plurality of fourth trenches TR4") may be provided on the first active pattern ACT1. Each fourth trench TR4 may be defined between the first and second source/drain regions SD1 and SD2 of the first active pattern ACT1. Each fourth trench TR4 may be disposed to run ("extend") across the first and second active patterns ACT1 and ACT2, the field pattern FR, and the first, second, and third device isolation layers ST1, ST2, and ST3. Each fourth trench TR4 may have a depth less than those of the first, second, and third trenches TR1, TR2, and TR3. Each fourth trench TR4 may extend in the first direction X. The fourth trench TR4 may intersect the third trench TR3. When each fourth trench TR4 extends in the first direction X, the third trench TR3 intersecting the fourth trench TR4 may extend in the second direction Y.

A first line structure LST1 may be provided in each fourth trench TR4. In some example embodiments, the first line structure LST1 may include a gate dielectric pattern GI, a word line WL, and a second gap-fill dielectric pattern GP2 Accordingly, it will be understood that a plurality of work lines WL may be in separate, respective fourth trenches TR4. The gate dielectric pattern GI may be disposed on a lower inner wall of the fourth trench TR4. The gate dielectric pattern GI may include one or more of a silicon oxide layer, a silicon nitride layer, a silicon oxynitride layer, and a high-k dielectric material. In some example embodiments, the high-k dielectric material may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof. The word line WL may be disposed on the gate dielectric pattern GI. The word line WL may fill a lower portion of the fourth trench TR4. The word line WL may include one or more of conductive metal nitride (e.g., titanium nitride or tantalum nitride) and metal (e.g., titanium, tantalum, tungsten, copper, or aluminum). The second gap-fill dielectric pattern GP2 may be disposed on the word line WL. Accordingly, it will be understood that a plurality of second gap-fill dielectric patterns GP2 may be on separate, respective word lines WL. The second gap-fill dielectric pattern GP2 may fill an upper portion of the fourth trench TR4. The second gap-fill dielectric pattern GP2 may have a top surface coplanar with those of the first, second, and third device isolation layers ST1, ST2, and ST3. The second gap-fill dielectric pattern GP2 may include one or more of silicon oxide, silicon nitride, and silicon oxynitride.

Referring to FIGS. 2A to 2C, the sidewall segment SW of the buried dielectric pattern BI may include a lower part LP, a middle part MP, and an upper part UP.

The lower part LP may be disposed between a bottom surface SN_BS of the dielectric liner pattern SN and a floor TR4_F of the fourth trench TR4. The lower part LP may be on a sidewall TR3_SW of the third trench TR3. In some example embodiments, the lower part LP may be disposed between a lower corner SN_LC of the dielectric liner pattern SN and a floor TR4_F of the fourth trench TR4. The lower part LP may have a thickness LP_T greater than a thickness BP_T of the floor segment BP. In some example embodiments, the thickness LP_T of the lower part LP may be about 1.2 times greater than the thickness BP_T of the floor segment BP. When the thickness BP_T of the floor segment BP is about 30 nm, the thickness LP_T of the lower part LP may be about 36 nm.

The middle part MP may be disposed on the lower part LP. The middle part MP may be disposed between a pair of word lines WL. In some example embodiments, the middle part MP may be disposed between a pair of gate dielectric patterns GI. The middle part MP may have a thickness MP_T less than the thickness LP_T of the lower part LP and greater than the thickness BP_T of the floor segment BP. The thickness MP_T of the middle part MP may be greater than the thickness UP_T of the upper part UP.

The upper part UP may be disposed on the middle part MP. The upper part UP may be disposed between a pair of second gap-fill dielectric patterns GP2. Accordingly, it will be understood that the upper part UP may be between adjacent second gap-fill dielectric patterns GP2 of the plurality of second gap-fill dielectric patterns GP2. The thickness UP_T of the upper part UP may be less than each of the thickness MP_T of the middle part MP and the thickness LP_T of the lower part LP. The thickness UP_T of the upper part UP may be greater than the thickness BP_T of the floor segment BP. The thickness UP_T of the upper part UP may be about 1.1 times greater than the thickness BP_T of the floor segment BP. When the thickness BP_T of the floor segment BP is about 30 nm, the thickness UP_T of the upper part UP may be about 36 nm.

Referring back to FIGS. 1 and 2A to 2C, a first interlayer dielectric layer IL1 may be provided on the substrate W. The first interlayer dielectric layer IL1 may selectively expose the first source/drain regions SD1 of the first active patterns ACT1.

The first interlayer dielectric layer IL1 may be provided thereon with second line structures LST2 extending in the second direction Y. The second line structures LST2 may be spaced apart from each other in the first direction X. When viewed in plan, the second line structure LST2 may intersect the word line WL. A pair of spacers SP may be provided on opposite sidewalls of the second line structure LST2. The spacers SP may include one or more of a silicon oxide layer, a silicon nitride layer, and a silicon oxynitride layer.

The second line structure LST2 may include a conductive pattern CP, a barrier pattern BA, a bit line BL, and a dielectric capping pattern IC that are sequentially stacked. As shown in at least FIG. 2A, the bit line BL may be on a first source/drain region SD1. The conductive pattern CP may selectively contact the first source/drain region SD1. The barrier pattern BA may suppress a metallic material in the bit line BL from diffusing toward the conductive pattern CP. The bit line BL may be electrically connected to the first source/drain region SD1 through the barrier pattern BA and the conductive pattern CP.

The conductive pattern CP may include one of a doped semiconductor material (e.g., doped silicon or doped germanium), a metallic material (e.g., titanium, tantalum, tungsten, copper, or aluminum), and a metal-semiconductor compound (e.g., tungsten silicide, cobalt silicide, or titanium silicide). The barrier pattern BA may include conductive metal nitride (e.g., titanium nitride or tantalum nitride). The bit line BL may include a metallic material (e.g., titanium, tantalum, tungsten, copper, or aluminum).

A second interlayer dielectric layer IL2 may be provided on the first interlayer dielectric layer IL1. The second interlayer dielectric layer IL2 may cover the spacers SP. Contact holes CNH may be provided to penetrate the second and first interlayer dielectric layers IL2 and IL1 and to expose the second source/drain regions SD2.

Contacts CNT may be provided in the contact holes CNH. The contacts CNT may contact the second source/drain regions SD2. The spacers SP may separate the contact CNT from the bit line BL. The contact CNT may include one or more of conductive metal nitride (e.g., titanium nitride or tantalum nitride) and metal (e.g., titanium, tantalum, tungsten, copper, or aluminum).

Data storage elements DS may be provided on the contacts CNT. As shown in at least FIG. 2A, a data storage element DS may be on a second source/drain region SD2. The data storage elements DS may be a memory element using one of a capacitor, a magnetic tunnel junction pattern, and a variable resistance layer that includes a phase change material. In some example embodiments, the data storage elements DS may be capacitors.

The following will describe a method of fabricating a semiconductor device configured above.

FIGS. 3, 5, 7, 9, and 11 illustrate plan views showing a method of fabricating the semiconductor device shown in FIG. 1 according to some example embodiments of the present inventive concepts. FIGS. 4A, 6A, 8A, 10A, and 12A illustrate cross-sectional views taken along line A-A' of FIGS. 3, 5, 7, 9, and 11, respectively, according to some example embodiments of the present inventive concepts. FIGS. 4B, 6B, 8B, 10B, and 12B illustrate cross-sectional views taken along line B-B' of FIGS. 3, 5, 7, 9, and 11, respectively, according to some example embodiments of the present inventive concepts. FIGS. 4C, 6C, 8C, 10C, and 12C illustrate cross-sectional views taken along line C-C' of FIGS. 3, 5, 7, 9, and 11, respectively, according to some example embodiments of the present inventive concepts.

Referring to FIGS. 3 and 4A to 4C, an upper portion of a substrate W may be patterned to form first and second active patterns ACT1 and ACT2 and a field pattern FR. The first and second active patterns ACT1 and ACT2 may have a first conductive region implanted with first dopants. The first and second active patterns ACT1 and ACT2 may be divided respectively by first and second trenches TR1 and TR2, and a pair of field patterns FR may be divided by a third trench TR3. The first trench TR1 may be defined between a pair of first active patterns ACT1. The second trench TR2 may be defined between neighboring second active patterns ACT2. The third trench TR3 may be defined by a pair of field patterns FR. The first trench TR1 may have a width less than that of the third trench TR3.

Referring to FIGS. 5 and 6A to 6C, a buried dielectric layer FBI may be formed on the substrate W.

Figure 5:
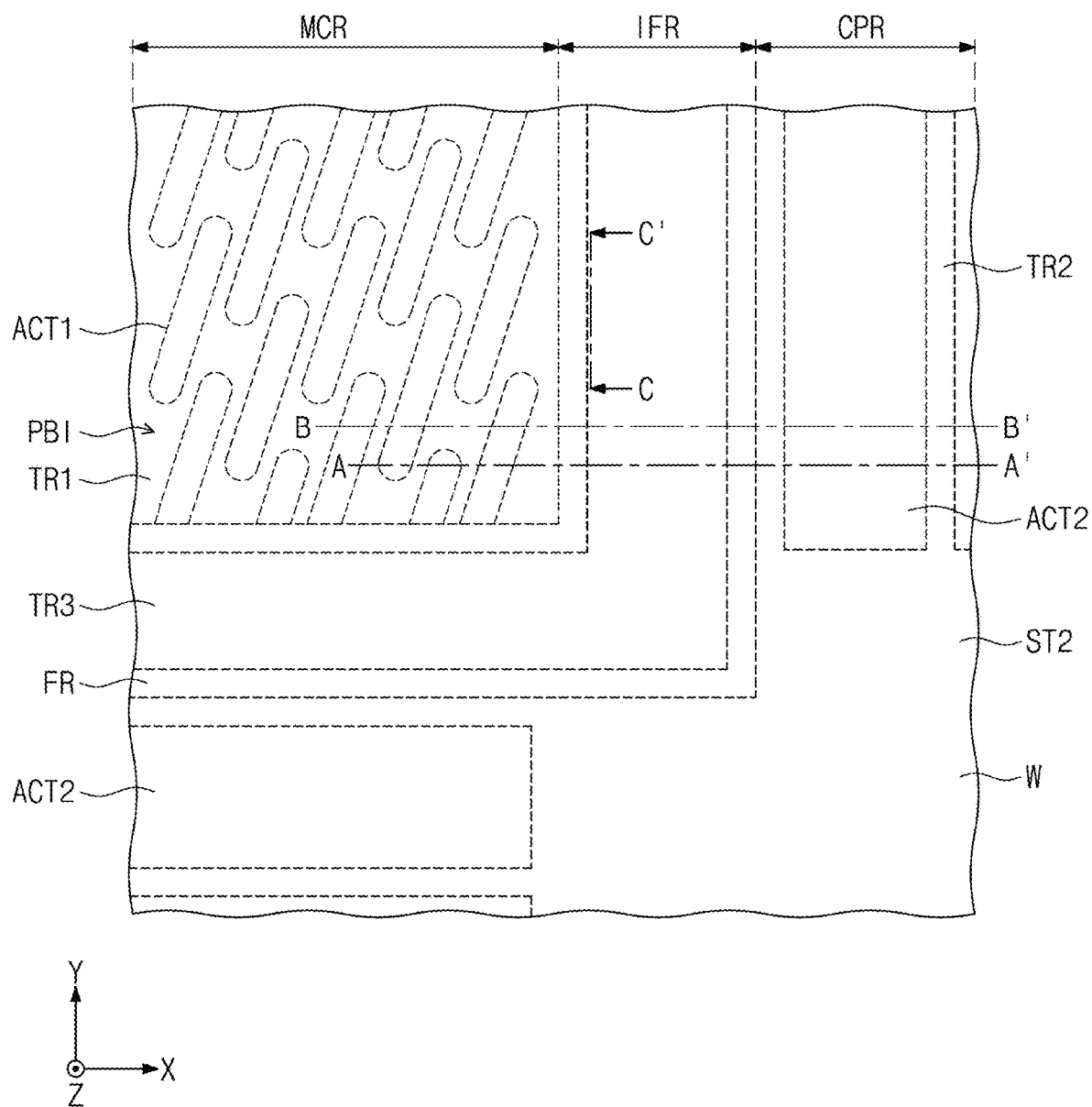
Figure 6A:
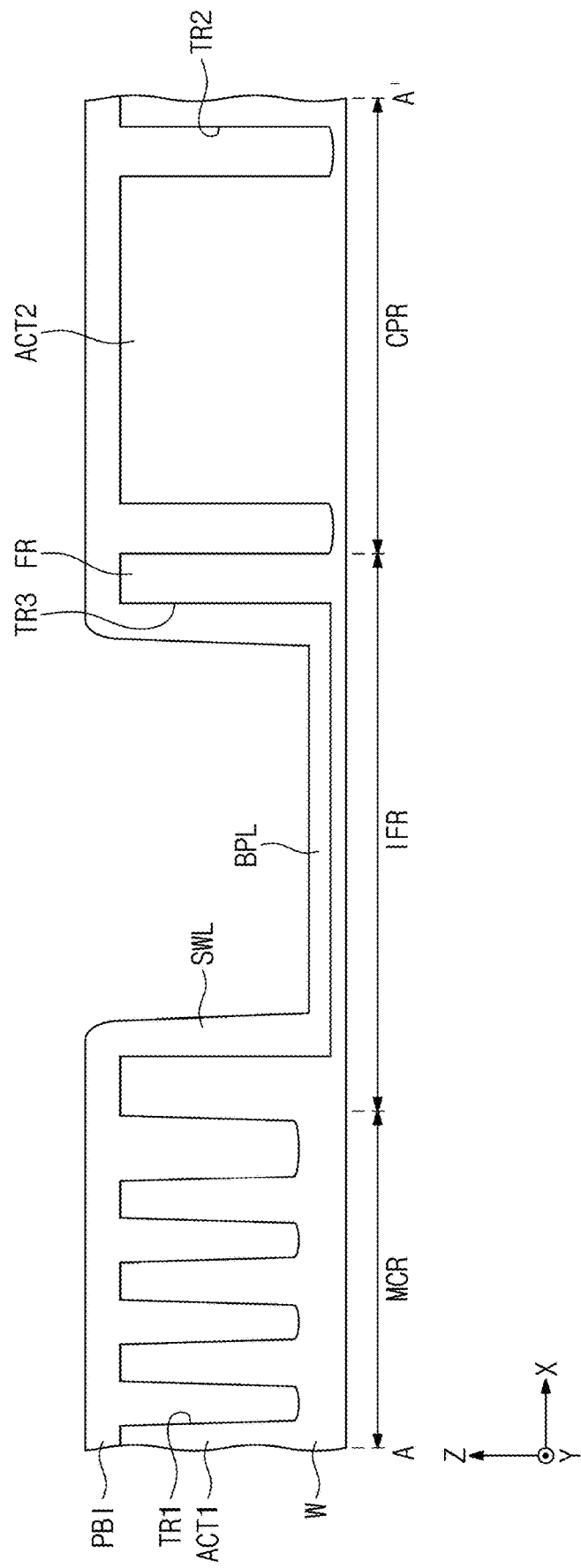
Figure 6B:
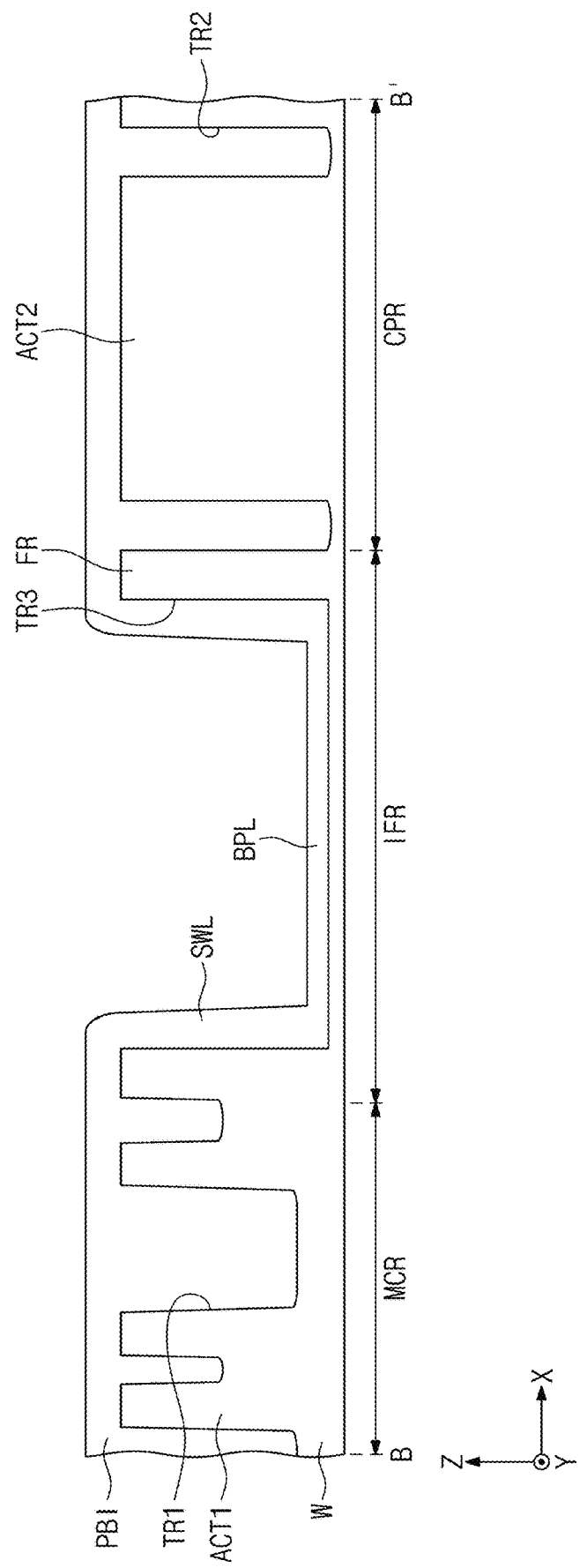
Figure 6C:
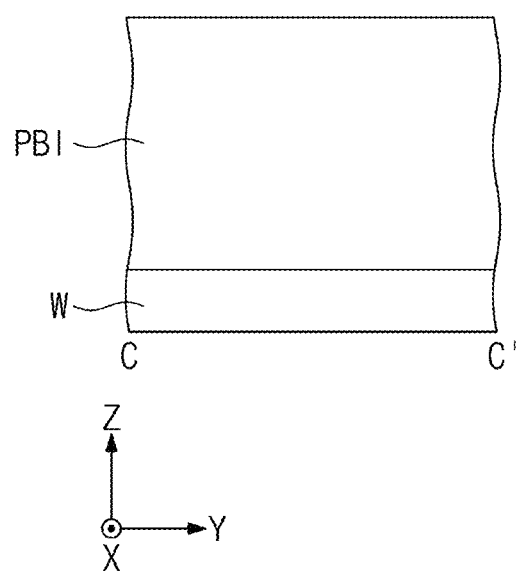
Figure 7:
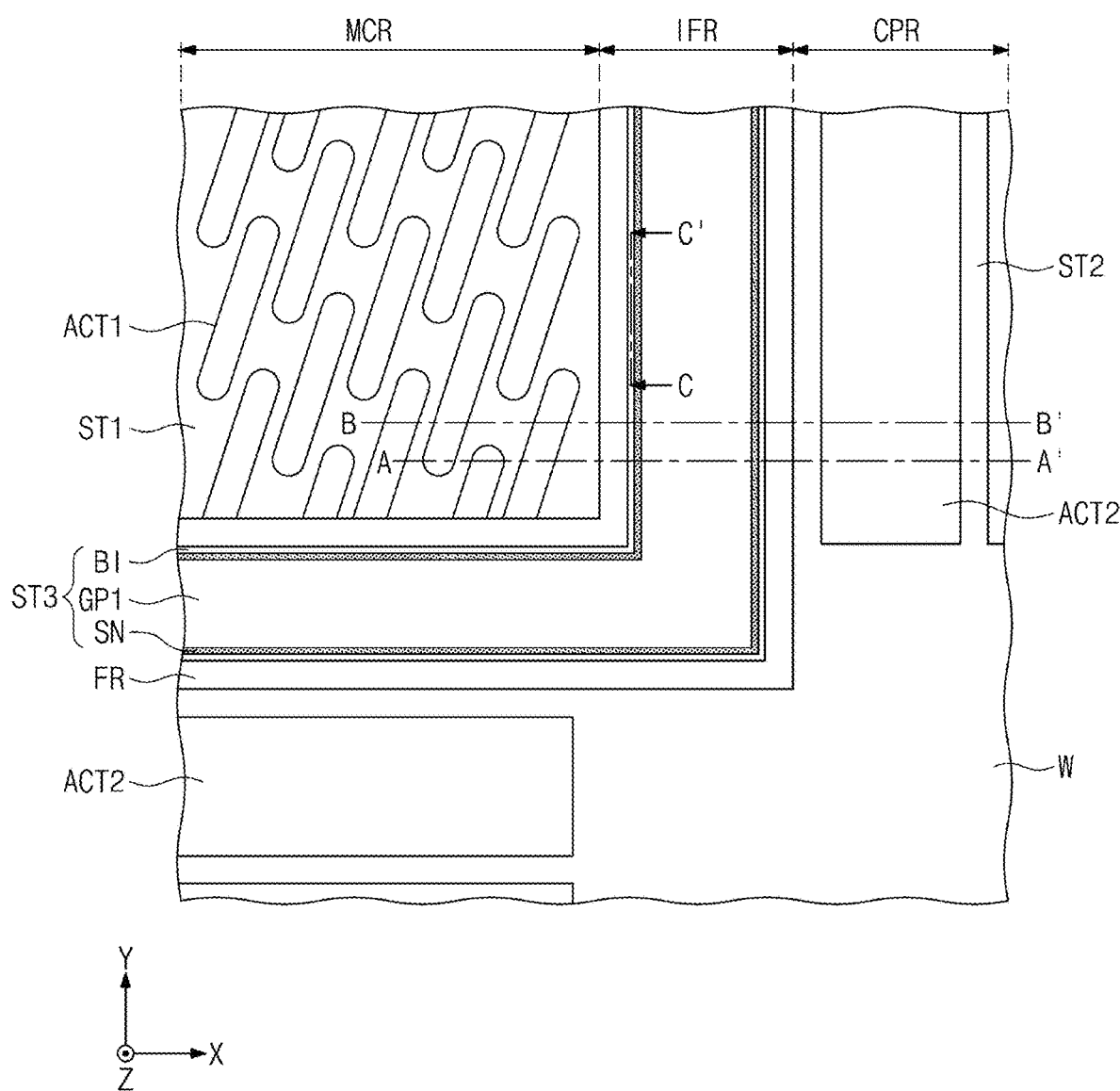
Figure 8A:
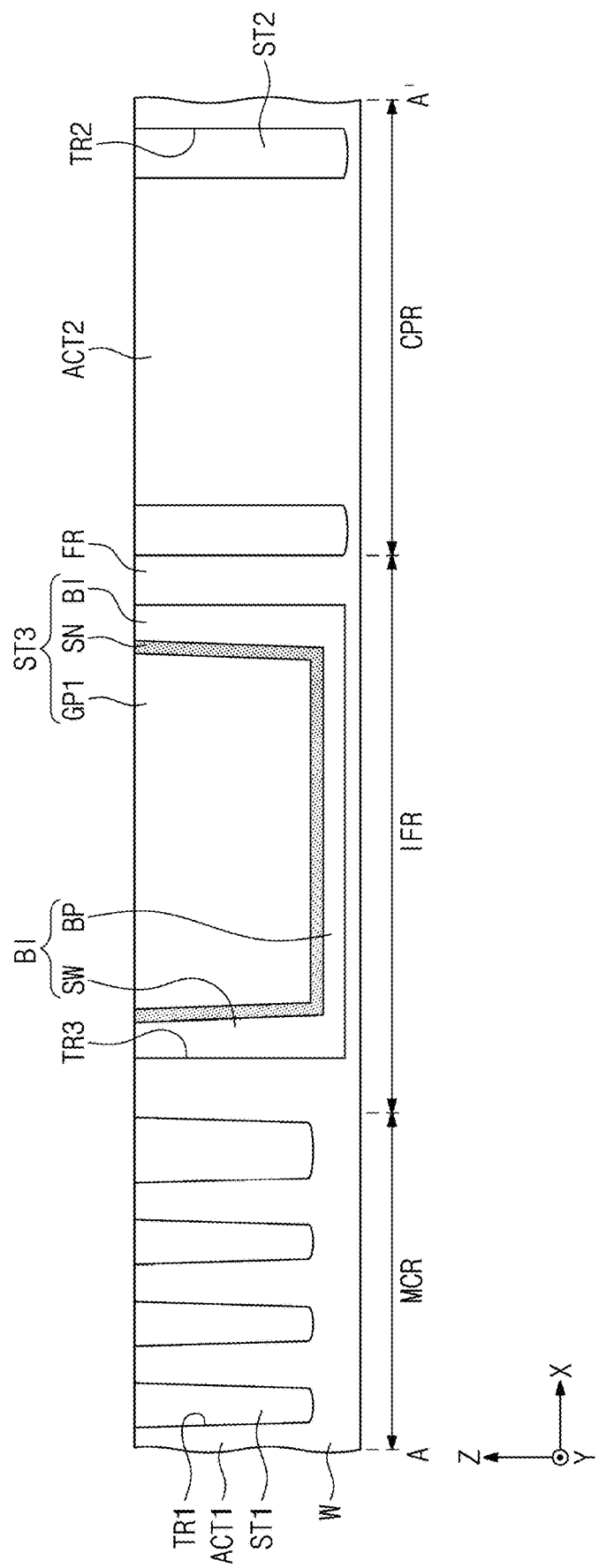
Figure 8B:
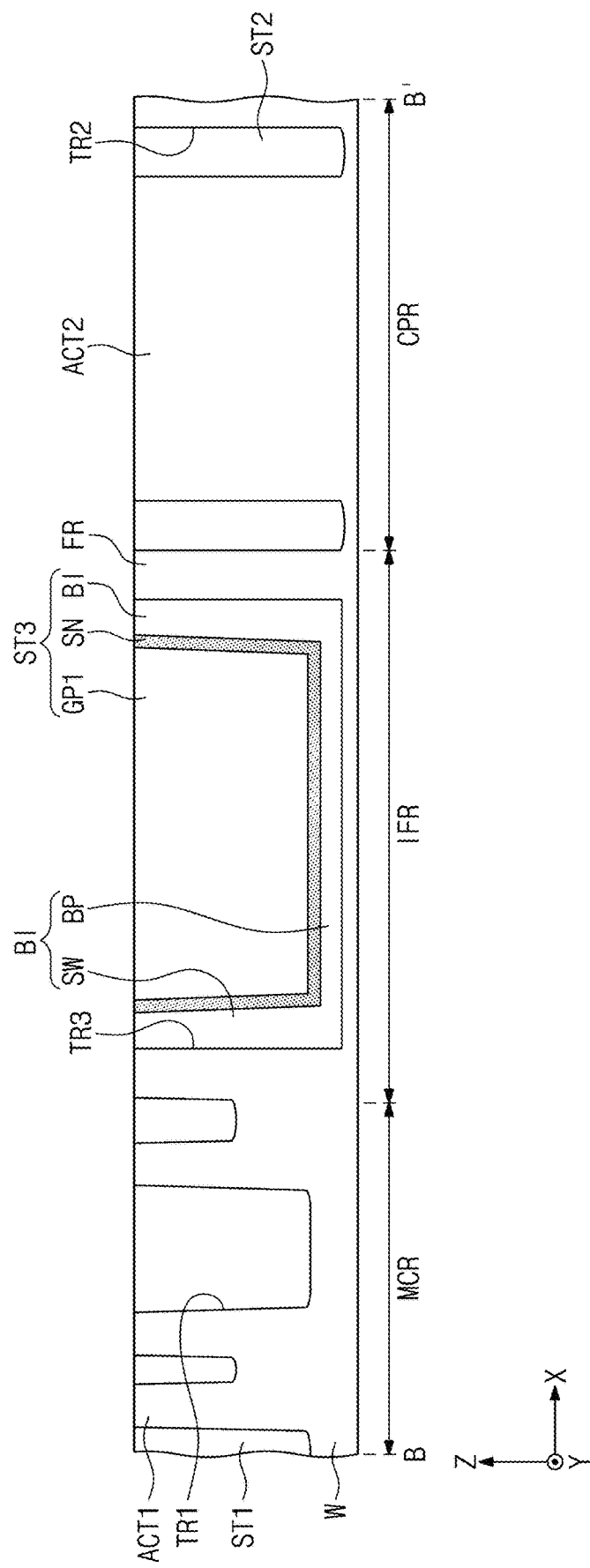
Figure 8C:
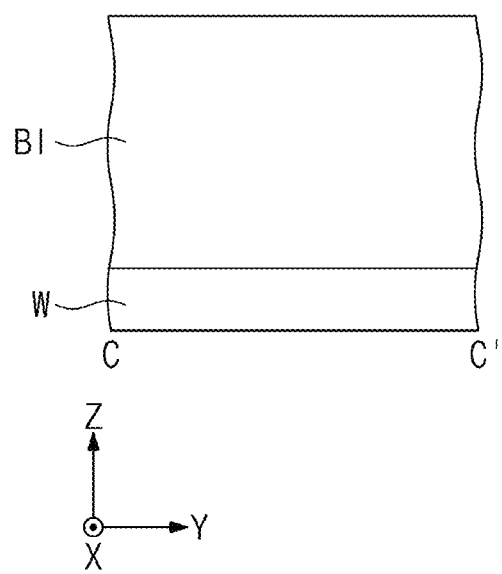
Figure 9:
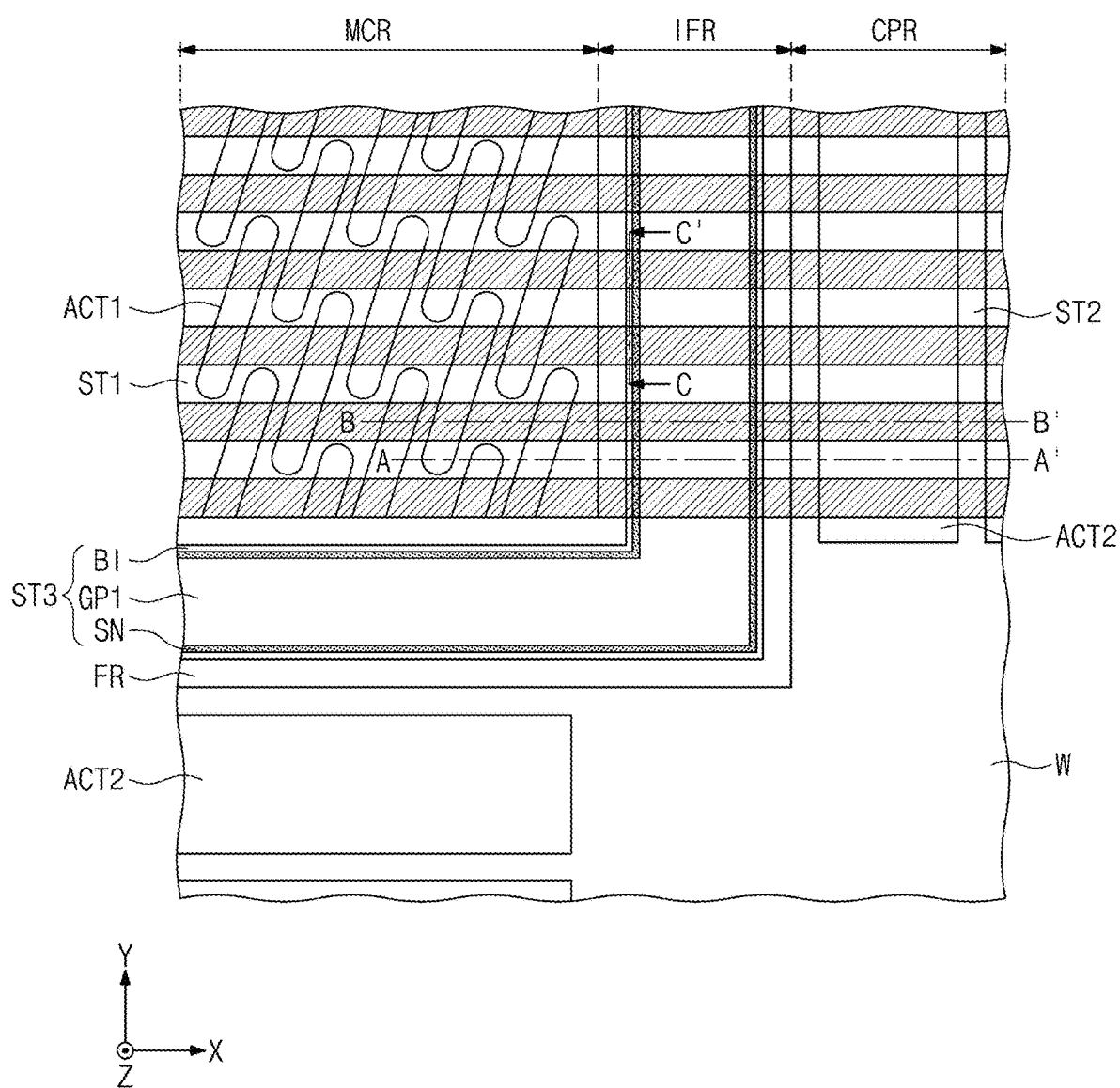
Figure 10A:
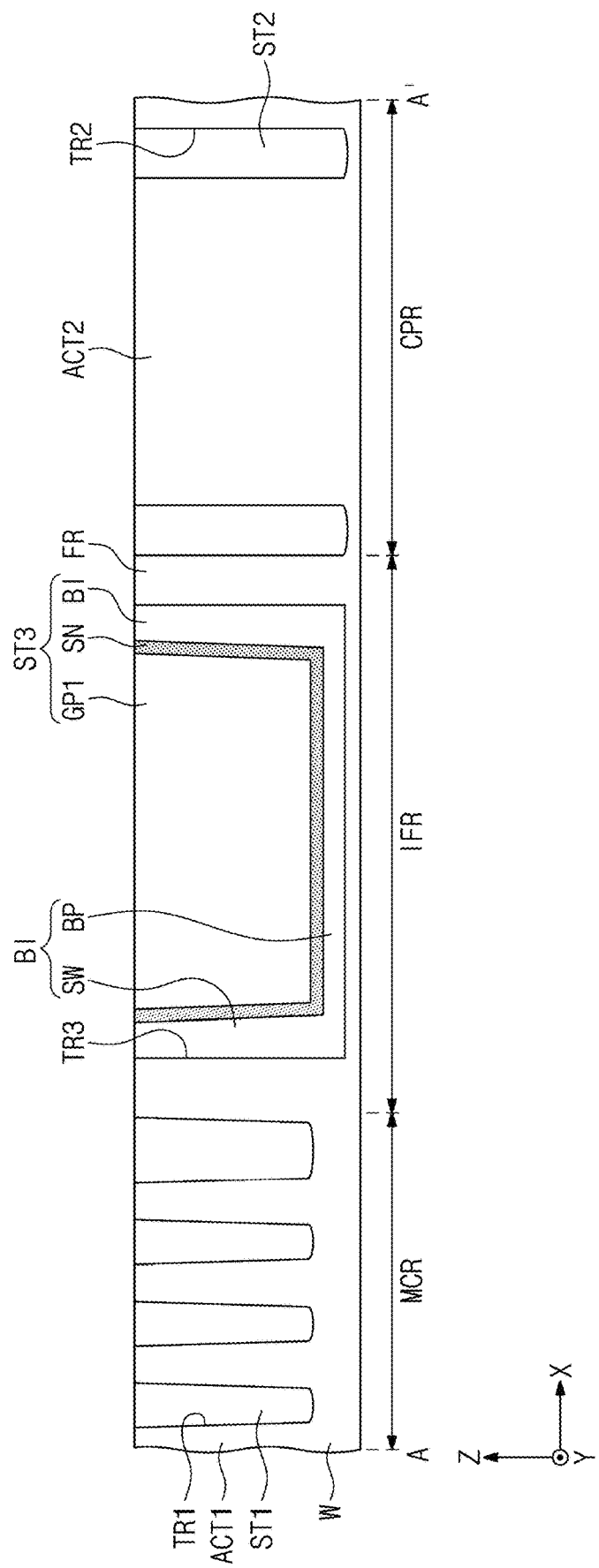
Figure 10B:
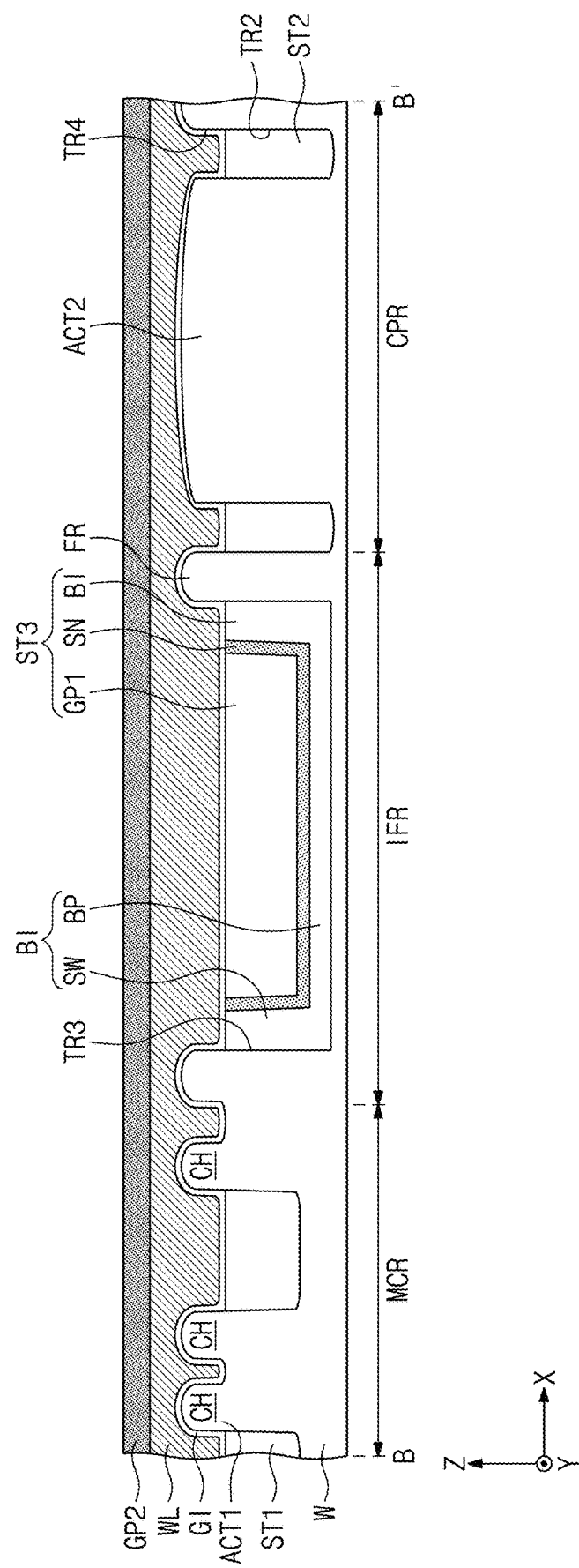
Figure 10C:
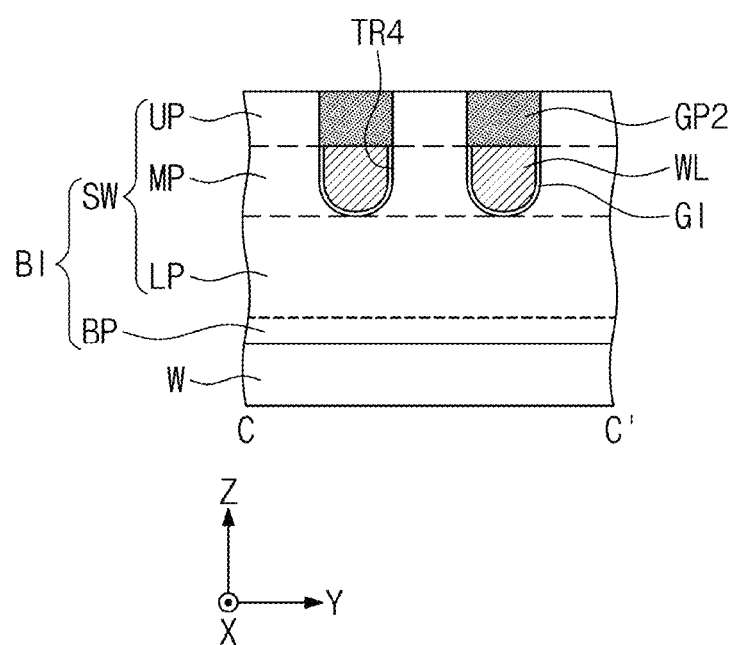
Figure 11:
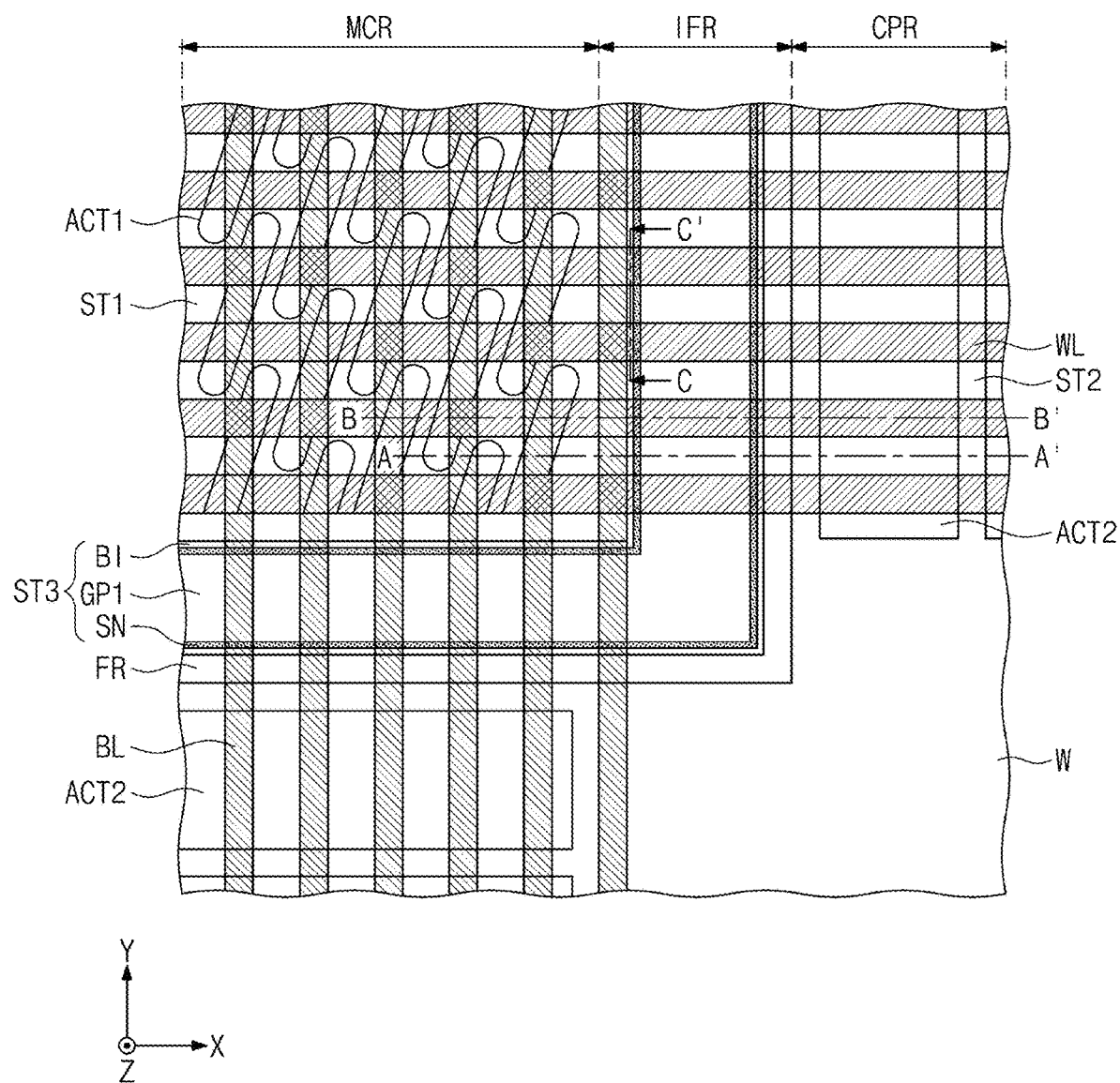
Figure 12A:
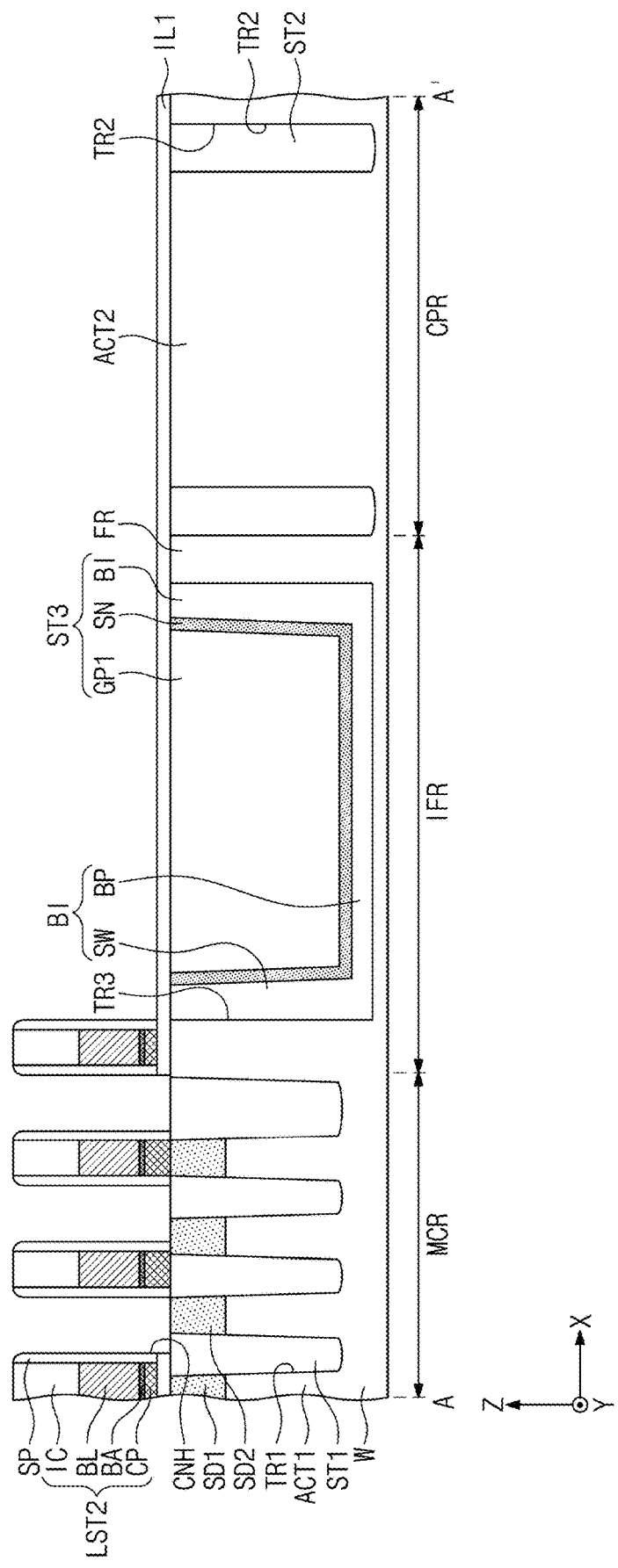
Figure 12B:
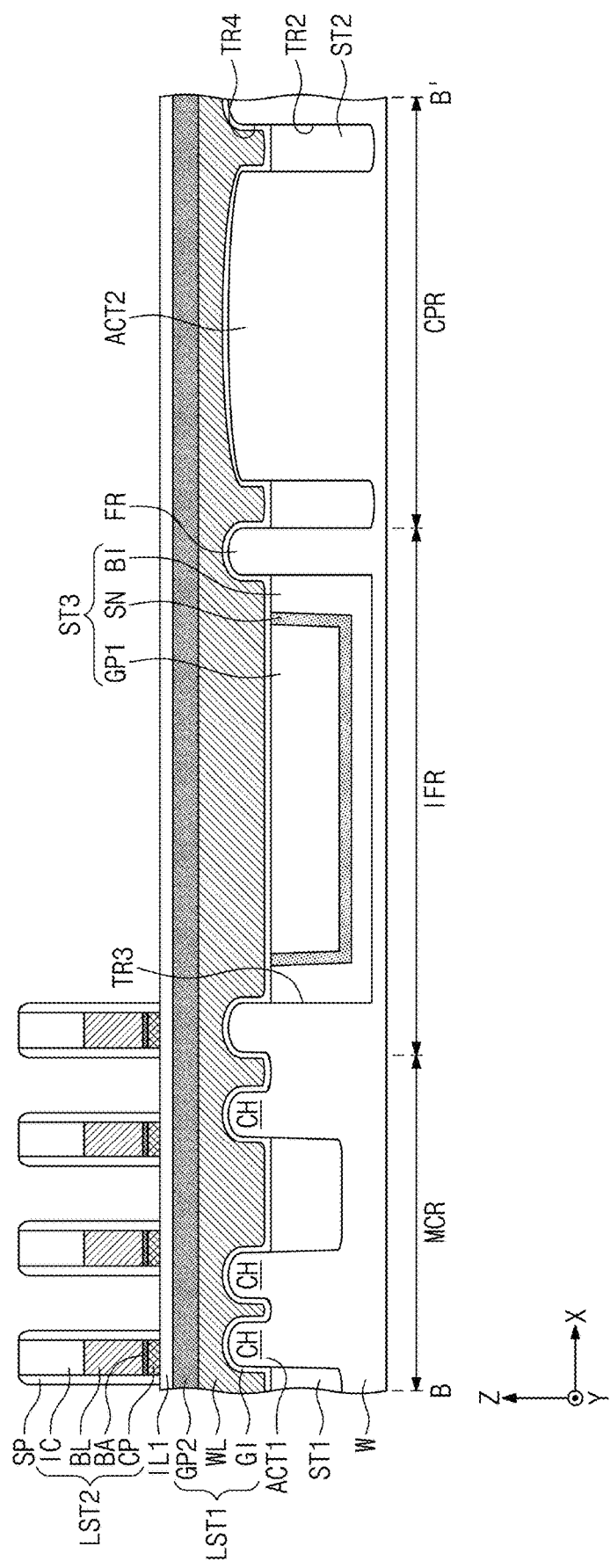
Figure 12C:
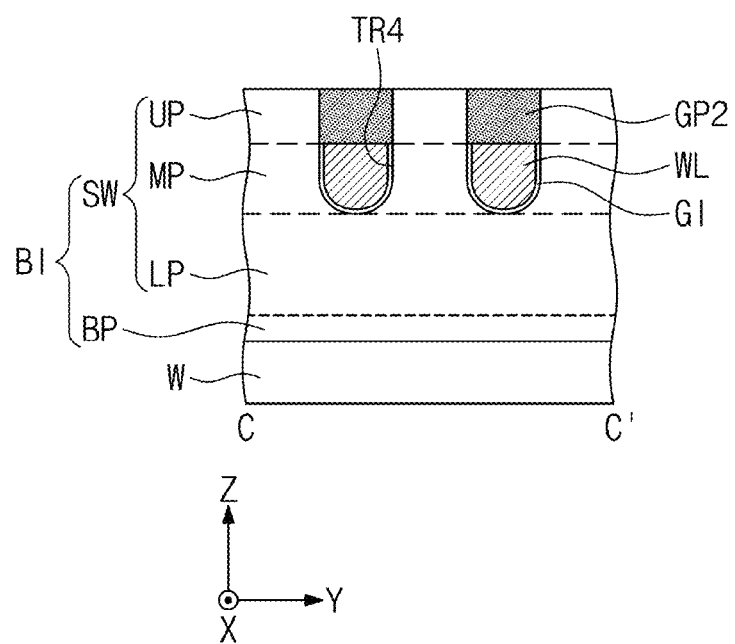
Figure 13:
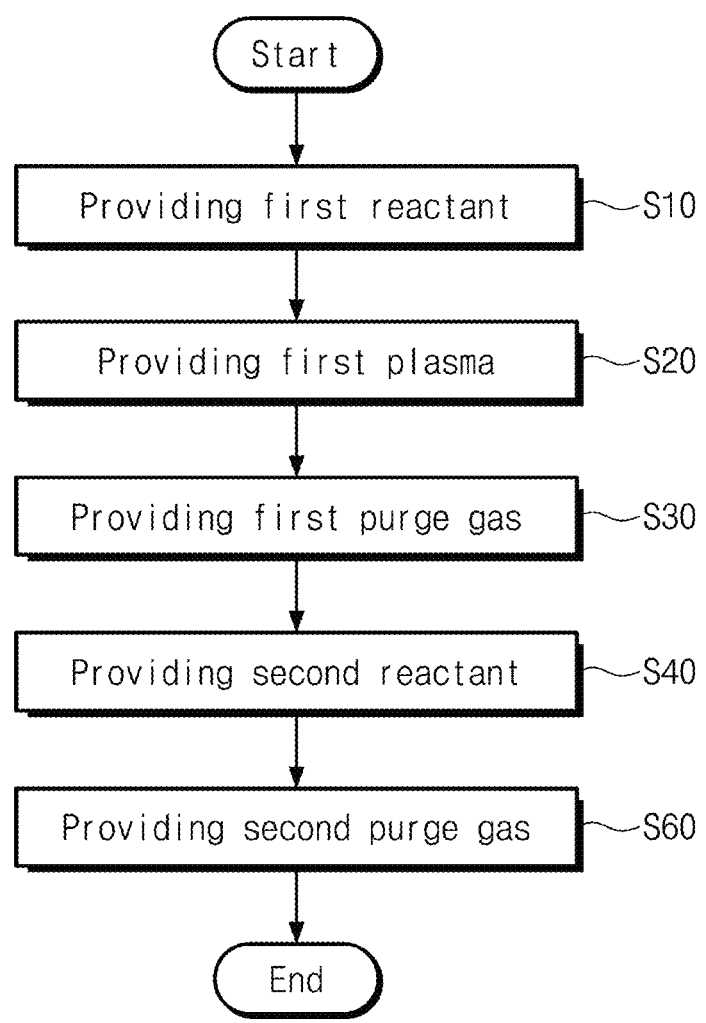
FIGS. 13 and 14 illustrate flow charts showing an example of forming a buried dielectric layer shown in FIG. 5 according to some example embodiments of the present inventive concepts.

FIG. 13 illustrates a flow chart showing an example of forming the buried dielectric layer PBI shown in FIG. 5 according to some example embodiments of the present inventive concepts.

Referring to FIG. 13, the formation of the buried dielectric layer PBI may include performing advanced atomic layer deposition (ALD) or applied atomic layer deposition (ALD). In some example embodiments, the formation of the buried dielectric layer PBI may include performing advanced chemical vapor deposition (CVD) or applied chemical vapor deposition (CVD). In some example embodiments, the formation of the buried dielectric layer PBI may include providing a first reactant (S10), providing a first plasma (S20), providing a first purge gas (S30), providing a second reactant (S40), and providing a second purge gas (S60).

Referring to FIGS. 5, 6A to 6C, and 13, a first reactant may be provided onto the substrate W (S10). The first reactant may be deposited or adsorbed on an entire surface of the substrate W. In some example embodiments, the first reactant may include a silicon-containing reactant. The first reactant may be silane, halosilane, or aminosilane. The silane may include monosilane ($SiH_4$), disilane ($Si_2H_6$), or organosilane such as methyl silane, ethyl silane, isopropyl silane, t-butyl silane, dimethyl silane, diethyl silane, di-t-butyl silane, allyl silane, secondary butyl silane, t-hexyl silane, isoamyl silane, t-butyl disilane, di-t-butyl disilane, and tetra-ethyl-ortho-silicate (TEOS, also called tetra-ethoxy-silane). The halosilane may include iodine silane, bromosilane, chlorosilane, or fluorosilane. The aminosilane may include mono amino silane, diamino silane, triamino silane, tetraamino silane, t-butyl amino silane, methyl amino silane, tert-butyl silane amine, or bis(tert-butyl amino)silane.

A first plasma may be provided onto the substrate W (S20). The first plasma may be provided mainly on top surfaces of the first active patterns ACT1, top surfaces of the second active patterns ACT2, a top surface of the field pattern FR, and a floor of the third trench TR3. The first plasma may partially remove the first reactant on the top surfaces of the first active pattern ACT1, the top surfaces of the second active patterns ACT2, and the top surface of the field pattern FR, and the floor of the third trench TR3. The first reactant may remain in the first and second trenches TR1 and TR2. The first reactant may also remain on a sidewall of the third trench TR3.

A first purge gas may be provided onto the substrate W (S30). The first purge gas may include a nitrogen ($N_2$) gas.

A second reactant may be provided onto the substrate W (S40). The second reactant may include an oxidizing reactant. The oxidizing reactant may be oxygen, ozone, nitrous oxide, or carbon monoxide. The second reactant and the first reactant may react to form a buried dielectric layer PBI.

A second purge gas may be provided onto the substrate W (S60). The second purge gas may include a nitrogen ($N_2$) gas. The second purge gas may remove a gas after reaction of the first and second reactants.

The steps S10 to S60 may be repeatedly performed until the buried dielectric layer PBI fills the first and second trenches TR1 and TR2. The buried dielectric layer PBI may have an irregular thickness in the third trench TR3. The buried dielectric layer PBI may include a floor layer BPL and a sidewall layer SWL. The floor layer BPL may be formed thinner than the sidewall layer SWL.

Figure 14:
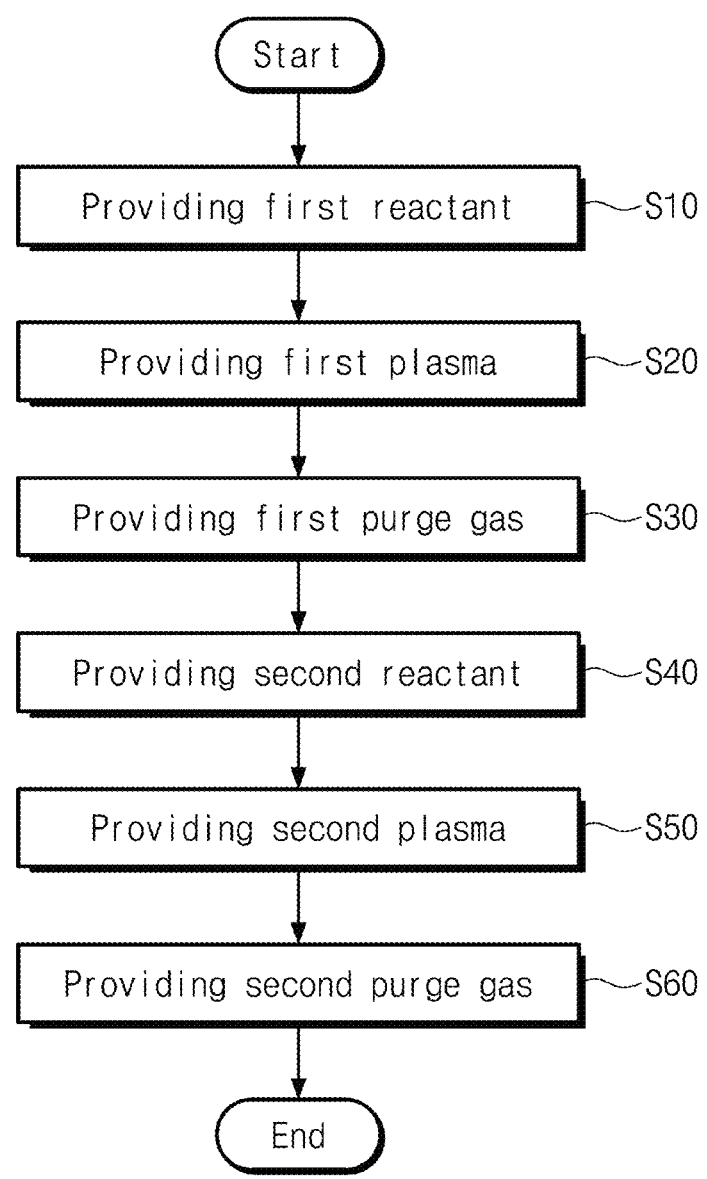

FIG. 14 illustrates a flow chart showing an example of forming the buried dielectric layer PBI shown in FIG. 5 according to some example embodiments of the present inventive concepts. In some example embodiments, a detailed description of technical features repetitive to those in the formation of the buried dielectric layer PBI discussed above with reference to FIG. 13 will be omitted, and a difference thereof will be discussed in detail.

Referring to FIG. 14, the formation of the buried dielectric layer PBI may further include providing a second plasma (S50). The providing the second plasma (S50) may be performed between providing the second reactant (S40) and providing the second purge gas (S60). The second plasma may partially remove the buried dielectric layer PBI on the top surfaces of the first active patterns ACT1, the top surfaces of the second active patterns ACT2, the top surface of the field pattern FR, and the floor of the third trench TR3. The buried dielectric layer PBI may remain in the first and second trenches TR1 and TR2. The buried dielectric layer PBI may also remain on the sidewall of the third trench TR3. In the third trench TR3, the sidewall layer SWL of the buried dielectric layer PBI may be formed thicker than the floor layer BPL of the buried dielectric layer PBI.

Referring back to FIGS. 5 and 6A to 6C, the buried dielectric layer PBI may fill the first trench TR1 without creating defects such as voids or seams. When the first trench TR1 is filled with the buried dielectric layer PBI devoid of defects such as voids or seams, the first active pattern ACT1 may improve in uniformity of threshold voltage. When the buried dielectric layer PBI has defects such as voids or seams, the first active pattern ACT1 may decrease in uniformity of threshold voltage.

A dielectric liner layer and a first gap-fill dielectric layer may be formed on the buried dielectric layer PBI. The dielectric liner layer may be conformally formed. The dielectric liner layer may include silicon nitride formed by atomic layer deposition (ALD). The first gap-fill dielectric layer may include silicon oxide, such as TOSZ (tonen silazane), USG (undoped silicate glass), BPS G (boro-phospho-silicate glass), PSG (phospho-silicate glass), FOX (flowable oxide), PE-TEOS (plasma enhanced tetra-ethyl-ortho-silicate), or FSG (fluoride silicate glass). The first gap-fill dielectric layer may fill the third trench TR3. The first gap-fill dielectric layer may partially fill the second trench TR2.

Referring to FIGS. 7 and 8A to 8C, the dielectric liner layer and the first gap-fill dielectric layer may be partially polished to form a dielectric liner pattern SN and a first gap-fill dielectric pattern GP1. The dielectric liner layer may serve as a polishing stopper.

A wet etching process may be performed such that the buried dielectric layer PBI on the first and second active patterns ACT1 and ACT2 is wet-etched to form a buried dielectric pattern BI. The buried dielectric pattern BI may include a floor segment BP and a sidewall segment SW. The sidewall segment SW may be thicker than the floor segment BP. The dielectric liner pattern SN and the first gap-fill dielectric pattern GP1 may be partially removed through the wet etching process performed on the buried dielectric layer PBI. The wet etching process may use an etchant including a strong acid (e.g., LAL solution or phosphoric acid). The substrate W may be flat etched.

Referring to FIGS. 9 and 10A to 10C, an upper portion of the substrate W may be patterned to form fourth trenches TR4. When viewed in plan, the fourth trench TR4 may have a linear shape extending in a first direction X.

The formation of the fourth trenches TR4 may include forming a hardmask pattern having an opening and performing an etching process in which the hardmask pattern is used as an etching mask to partially etch the first and second active patterns ACT1 and ACT2, the field pattern FR, and the first, second, and third device isolation layers ST1, ST2, and ST3. As shown in FIGS. 2A-2C, the fourth trench TR4 may be shallower than the first, second, and third trenches TR1, TR2, and TR3.

During the etching process, the first, second, and third device isolation layers ST1, ST2, and ST3 may be etched more than the first and second active patterns ACT1 and ACT2 and the field pattern FR. The first and second active patterns ACT1 and ACT2 in the fourth trench TR4 may protrude in a third direction Z with respect to the first and second device isolation layers ST1 and ST2. In some example embodiments, the first and second active patterns ACT1 and ACT2 in the fourth trench TR4 may have a fin shape.

A gate dielectric pattern GI, a word line WL, and a second gap-fill dielectric pattern GP2 may be formed in each of the fourth trenches TR4. In some example embodiments, a gate dielectric layer may be conformally formed in the fourth trench TR4. The gate dielectric layer may include one or more of a silicon oxide layer, a silicon nitride layer, a silicon oxynitride layer, and a high-k dielectric material. A conductive layer may be formed on the gate dielectric layer, filling the fourth trench TR4. The conductive layer may include one or more of metal and conductive metal nitride. The conductive layer and the gate dielectric layer may be recessed to form the gate dielectric pattern GI and the word line WL. The second gap-fill dielectric pattern GP2 may be formed in an upper portion of the fourth trench TR4 in which are formed the gate dielectric pattern GI and the word line WL. The second gap-fill dielectric pattern GP2 may have a top surface coplanar with those of the first and second active patterns ACT1 and ACT2, the field pattern FP, and the first, second, and third device isolation layers ST1, ST2, and ST3. The sidewall segment SW of the buried dielectric pattern BI may include a lower part LP, a middle part MP, and an upper part UP. The lower part LP may be defined between a bottom surface of the dielectric liner pattern SN and a floor of the fourth trench TR4. The middle part MP may be disposed between a pair of word lines WL. The upper part UP may be defined between a pair of second gap-fill dielectric patterns GP2.

Referring to FIGS. 11 and 12A to 12C, an implantation process may be performed to implant second dopants into the first and second active patterns ACT1 and ACT2. The second dopant may have a different conductive type from that of the first dopant.

A first source/drain region SD1 and a pair of second source/drain regions SD2 may be defined on an upper portion of the first active pattern ACT1. The pair of second source/drain regions SD2 may be spaced apart from each other across the first source/drain region SD1.

A channel region CH may be defined to refer to the first active pattern ACT1 below the word line WL. When viewed in plan, the channel region CH may be interposed between the first source/drain region SD1 and the second source/drain region SD2. The word line WL may be provided on a top surface and opposite sidewalls of the channel region CH.

A first interlayer dielectric layer IL1, a second line structure LST2, and spacers SP may be formed on the substrate W.

The first interlayer dielectric layer IL1 may be formed on the entire surface of the substrate W. The first interlayer dielectric layer IL1 may include, in some example embodiments, a silicon oxide layer. The first interlayer dielectric layer IL1 may be patterned to selectively expose the first source/drain region SD1.

A first conductive layer, a barrier layer, and a second conductive layer may be sequentially formed on the exposed first source/drain region SD1 and the first interlayer dielectric layer IL1. The first conductive layer may contact and/or have connection with the first source/drain region SD1. The first interlayer dielectric layer IL1 may vertically separate the first conductive layer from the second source/drain regions SD2 of the first active pattern ACT1. The first conductive layer may include one of a doped semiconductor material, a metallic material, and a metal-semiconductor compound.

The barrier layer may be formed to lie between the first conductive layer and the second conductive layer. The barrier layer may include conductive metal nitride. The second conductive layer may include a metallic material. The barrier layer may suppress a metallic material in the second conductive layer from diffusing toward the first conductive layer.

A dielectric capping pattern IC may be formed on the second conductive layer. The dielectric capping pattern IC may be formed to have a linear shape extending in a second direction Y. In some example embodiments, the dielectric capping pattern IC may include a silicon nitride layer or a silicon oxynitride layer.

The dielectric capping pattern IC may be used as an etching mask to sequentially etch the second conductive layer, the barrier layer, and the first conductive layer to respectively form a bit line BL, a barrier pattern BA, and a conductive pattern CP. The dielectric capping pattern IC, the bit line BL, the barrier pattern BA, and the conductive pattern CP may vertically overlap each other. The dielectric capping pattern IC, the bit line BL, the barrier pattern BA, and the conductive pattern CP may constitute the second line structure LST2.

The conductive pattern CP and the barrier pattern BA may be connected to the first source/drain region SD1. The bit line BL may be electrically connected to the first source/drain region SD1 through the conductive pattern CP and the barrier pattern BA. When viewed in plan, the bit line BL may intersect the word line WL.

A pair of spacers SP may be formed on opposite sidewalls of each of the second line structures LST2. The formation of the spacers SP may include conformally forming a spacer layer on the entire surface of the substrate 100 and anisotropically etching the spacer layer.

Referring back to FIGS. 1 and 2A to 2C, a second interlayer dielectric layer IL2 may be formed on the substrate W. In some example embodiments, the second interlayer dielectric layer IL2 may include a silicon oxide layer. A planarization process may be performed on the second interlayer dielectric layer IL2 until a top surface of the dielectric capping pattern IC is exposed.

A patterning process may be performed such that the second and first interlayer dielectric layers IL2 and IL1 are patterned to form contact holes CNH exposing the second source/drain regions SD2 of the first active patterns ACT1. Because the dielectric capping pattern IC and the spacers SP are used as an etching mask during the patterning process, the contact holes CNH may be formed in a self-alignment manner.

The contact holes CNH may be filled with a conductive material to form contacts CNT. The contacts CNT may be connected to the second source/drain regions SD2. A data storage element DS may be formed on each of the contacts CNT. In some example embodiments, the data storage element DS may be a capacitor.

According to the present inventive concepts, a semiconductor device may use a defect-free device isolation layer to improve uniformity of threshold voltage of an active pattern.

Some example embodiments have been described in the specification and drawings. Although specific terms are used herein, they are merely used for the purpose of describing the present inventive concepts rather than limiting technical meanings or scopes of the present inventive concepts disclosed in the claims. Therefore, it will be appreciated by a person of ordinary skill in the art that various modifications and equivalent embodiments can be made from the present inventive concepts. In conclusion, the authentic technical scope of the present inventive concepts to be protected shall be determined by the technical concepts of the accompanying claims.

What is claimed is:

1. A semiconductor device, comprising:
    a substrate including a device region and an interface region adjacent to the device region;
    a first trench on the device region;
    a first device isolation layer in the first trench, the first device isolation layer defining an active pattern of the device region;
    a second trench on the interface region;
    a second device isolation layer in the second trench, wherein the second device isolation layer includes
        a buried dielectric pattern,
        a dielectric liner pattern on the buried dielectric pattern, and
        a first gap-fill dielectric pattern on the dielectric liner pattern,
        wherein the buried dielectric pattern includes
            a floor segment on a floor of the second trench, and
            a sidewall segment on a sidewall of the second trench, the sidewall segment having a thickness different from a thickness of the floor segment; and
    a plurality of third trenches, each third trench of the plurality of third trenches extending across the first and second trenches,
    wherein the sidewall segment on the sidewall of the second trench includes a lower part between a bottom surface of the dielectric liner pattern and a floor of a third trench of the plurality of third trenches, a thickness of the lower part being greater than the thickness of the floor segment.

2. The semiconductor device of claim 1, wherein the thickness of the lower part is about 1.2 times greater than the thickness of the floor segment.

3. The semiconductor device of claim 1, wherein the sidewall segment further includes an upper part on the lower part between the third trenches, the thickness of the lower part being greater than a thickness of the upper part.

4. The semiconductor device of claim 3, wherein the thickness of the upper part is greater than the thickness of the floor segment.

5. The semiconductor device of claim 3, wherein the thickness of the upper part is about 1.1 times greater than the thickness of the floor segment.

6. The semiconductor device of claim 3, wherein
    the sidewall segment further includes a middle part between the lower part and the upper part, and
    a thickness of the middle part is greater than the thickness of the upper part and smaller than the thickness of the lower part.

7. The semiconductor device of claim 3, further comprising:
    a plurality of word lines in separate, respective third trenches of the plurality of third trenches; and
    a plurality of second gap-fill dielectric patterns on separate, respective word lines of the plurality of word lines,
    wherein the upper part is between adjacent second gap-fill dielectric patterns of the plurality of second gap-fill dielectric patterns.

8. The semiconductor device of claim 1, wherein
    the buried dielectric pattern and the first gap-fill dielectric pattern each include silicon oxide, and the buried dielectric pattern has a density greater than a density of the first gap-fill dielectric pattern.

9. A semiconductor device, comprising:
a first trench on a substrate, the first trench extending in a first direction;
a buried dielectric pattern on a sidewall and a floor of the first trench;
a dielectric liner pattern on the buried dielectric pattern;
a first gap-fill dielectric pattern on the dielectric liner pattern and filling the first trench; and
a plurality of second trenches extending in a second direction intersecting the first direction, the second trenches being shallower than the first trench,
wherein the buried dielectric pattern includes
a floor segment on the floor of the first trench, and
a sidewall segment on the sidewall of the first trench, the sidewall segment having a thickness different from a thickness of the floor segment.

10. The semiconductor device of claim 9, wherein the sidewall segment includes a lower part on the sidewall of the first trench between a bottom surface of the dielectric liner pattern and a floor of one second trench of the plurality of second trenches, a thickness of the lower part being greater than the thickness of the floor segment.

11. The semiconductor device of claim 10, wherein the sidewall segment further includes an upper part on the lower part, the thickness of the lower part being greater than a thickness of the upper part.

12. The semiconductor device of claim 11, wherein the thickness of the upper part is greater than the thickness of the floor segment.

13. The semiconductor device of claim 11, wherein
the thickness of the upper part is about 1.1 times greater than the thickness of the floor segment, and
the thickness of the lower part is about 1.1 times greater than the thickness of the floor segment.

14. A semiconductor device, comprising:
a substrate including first and second device regions and an interface region between the first and second device regions;
first and second trenches defining separate, respective active patterns of first and second active patterns on the first and second device regions;
a third trench on the interface region;
first, second, and third device isolation layers in separate, respective trenches of the first, second, and third trenches; and
a plurality of fourth trenches extending across the first and second active patterns,
wherein the third device isolation layer includes
a buried dielectric pattern,
a dielectric liner pattern on the buried dielectric pattern, and
a first gap-fill dielectric pattern on the dielectric liner pattern and filling the third trench,
wherein the buried dielectric pattern includes
a floor segment on a floor of the third trench, and
a sidewall segment on a sidewall of the third trench, the sidewall segment having a thickness greater than a thickness of the floor segment.

15. The semiconductor device of claim 14, further comprising:
a first line structure in each fourth trench of the plurality of fourth trenches,
wherein each first line structure includes
a gate dielectric pattern,
a word line on the gate dielectric pattern and extending in a first direction, and
a second gap-fill dielectric pattern on the word line.

16. The semiconductor device of claim 15, wherein the first active pattern includes
a channel region overlapping the word line in a direction perpendicular to directions in which the first, second, third, and fourth trenches extend,
a first source/drain region on one side of the word line, and
a second source/drain region on other side of the word line.

17. The semiconductor device of claim 16, further comprising:
a bit line on the first source/drain region, the bit line extending in a second direction intersecting the first direction; and
a data storage element on the second source/drain region.

18. The semiconductor device of claim 14, wherein
the first device region is a memory cell region,
the second device region is a core/peripheral circuit region, and
the interface region is a field region.

* * * * *